United States Patent
Li et al.

(10) Patent No.: US 11,695,059 B2
(45) Date of Patent: Jul. 4, 2023

(54) BOTTOM SOURCE/DRAIN ETCH WITH FIN-CUT-LAST-VTFET

(71) Applicant: International Business Machines Corporation, Armonk, NY (US)

(72) Inventors: Tao Li, Albany, NY (US); Indira Seshadri, Niskayuna, NY (US); Nelson Felix, Slingerlands, NY (US); Eric Miller, Watervliet, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/518,649

(22) Filed: Nov. 4, 2021

(65) Prior Publication Data
US 2022/0069106 A1 Mar. 3, 2022

Related U.S. Application Data

(62) Division of application No. 16/813,787, filed on Mar. 10, 2020, now Pat. No. 11,245,027.

(51) Int. Cl.
| | | |
|---|---|---|
| H01L 29/66 | (2006.01) | |
| H01L 29/08 | (2006.01) | |
| H01L 29/06 | (2006.01) | |
| H01L 27/092 | (2006.01) | |
| H01L 21/8238 | (2006.01) | |
| H01L 29/78 | (2006.01) | |

(52) U.S. Cl.
CPC ............... *H01L 29/66666* (2013.01); *H01L 21/823814* (2013.01); *H01L 21/823885* (2013.01); *H01L 27/092* (2013.01); *H01L 29/0653* (2013.01); *H01L 29/0847* (2013.01); *H01L 29/7827* (2013.01)

(58) Field of Classification Search
CPC .......... H01L 29/66666; H01L 29/0847; H01L 29/7827; H01L 21/823814; H01L 29/0653; H01L 27/092; H01L 21/823885
USPC .......................................................... 257/329
See application file for complete search history.

(56) References Cited

U.S. PATENT DOCUMENTS

| | | |
|---|---|---|
| 5,641,694 A | 6/1997 | Kenney |
| 7,138,685 B2 | 11/2006 | Hsu et al. |
| 7,586,149 B2 | 9/2009 | Yoon et al. |

(Continued)

FOREIGN PATENT DOCUMENTS

CN 1310315 C 4/2007

OTHER PUBLICATIONS

List of IBM Patents or Patent Applications Treated as Related; Date Filed: Nov. 4, 2021, 2 pages.

*Primary Examiner* — Mohammad M Hoque
(74) *Attorney, Agent, or Firm* — Cantor Colburn LLP; Joseph P. Curcuru

(57) ABSTRACT

A technique relates to a semiconductor device. A first epitaxial material is formed under a bottom surface of a set of fins, the first epitaxial material being under fin channel regions of the set of fins. A second epitaxial material is formed adjacent to the first epitaxial material and remote from the fin channel regions, a combination of the first epitaxial material and the second epitaxial material forming a bottom source or drain (source/drain) layer. A top source/drain layer is formed on an upper portion of the set of fins, gate material being disposed around the set of fins between the top source/drain layer and the bottom source/drain layer.

6 Claims, 21 Drawing Sheets

(56) References Cited

U.S. PATENT DOCUMENTS

| | | | |
|---|---|---|---|
| 9,530,700 B1 | 12/2016 | Mallela et al. | |
| 9,761,727 B2 | 9/2017 | Mallela et al. | |
| 9,812,443 B1 | 11/2017 | Cheng et al. | |
| 9,842,933 B1* | 12/2017 | Niimi | H01L 21/30604 |
| 9,865,705 B2 | 1/2018 | Cheng et al. | |
| 9,935,102 B1 | 4/2018 | Bi et al. | |
| 9,954,102 B1 | 4/2018 | Mochizuki et al. | |
| 10,141,446 B2 | 11/2018 | Niimi et al. | |
| 10,141,448 B1 | 11/2018 | Miao et al. | |
| 10,217,846 B1 | 2/2019 | Xie et al. | |
| 10,236,379 B2 | 3/2019 | Bentley et al. | |
| 10,249,731 B1 | 4/2019 | Li et al. | |
| 10,319,836 B1 | 6/2019 | Reznicek et al. | |
| 10,439,044 B1 | 10/2019 | Lee et al. | |
| 10,475,923 B1 | 11/2019 | Cheng et al. | |
| 2011/0291107 A1 | 12/2011 | Ritenour et al. | |
| 2012/0025286 A1 | 2/2012 | Nojima et al. | |
| 2012/0138886 A1* | 6/2012 | Kuhn | H01L 29/66439 438/479 |
| 2014/0264754 A1 | 9/2014 | Surthi et al. | |
| 2015/0187909 A1 | 7/2015 | Yan et al. | |
| 2016/0005852 A1 | 1/2016 | Kim et al. | |
| 2016/0071945 A1* | 3/2016 | Wang | H01L 29/775 438/151 |
| 2016/0268392 A1* | 9/2016 | Zhu | H01L 29/6681 |
| 2017/0084688 A1* | 3/2017 | Li | H01L 29/785 |
| 2018/0254344 A1 | 9/2018 | Cheng et al. | |
| 2019/0115452 A1 | 4/2019 | Cheng et al. | |
| 2019/0245083 A1 | 8/2019 | Reznicek et al. | |
| 2019/0326435 A1 | 10/2019 | Yeung et al. | |
| 2020/0020599 A1* | 1/2020 | Hong | H01L 21/30604 |
| 2021/0288164 A1 | 9/2021 | Li et al. | |

* cited by examiner

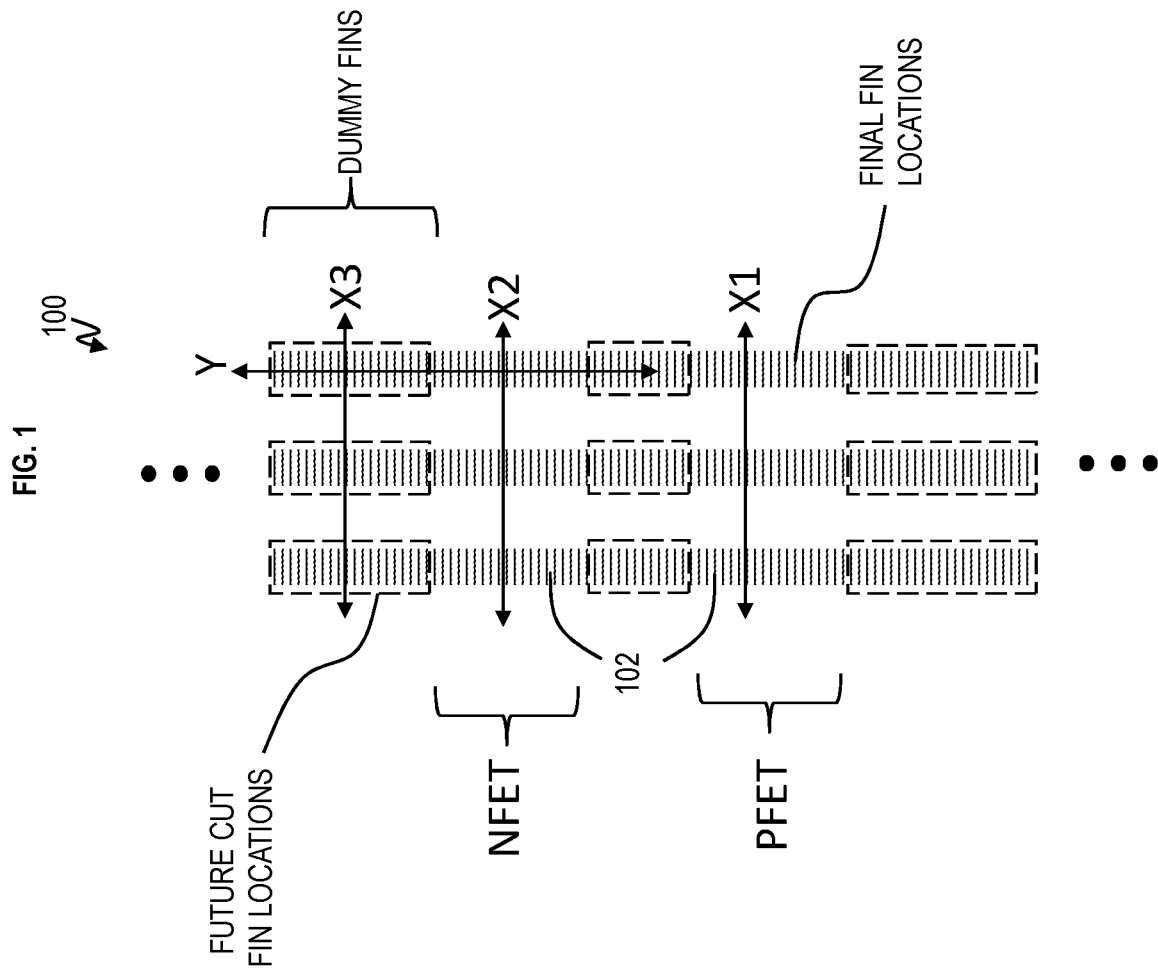

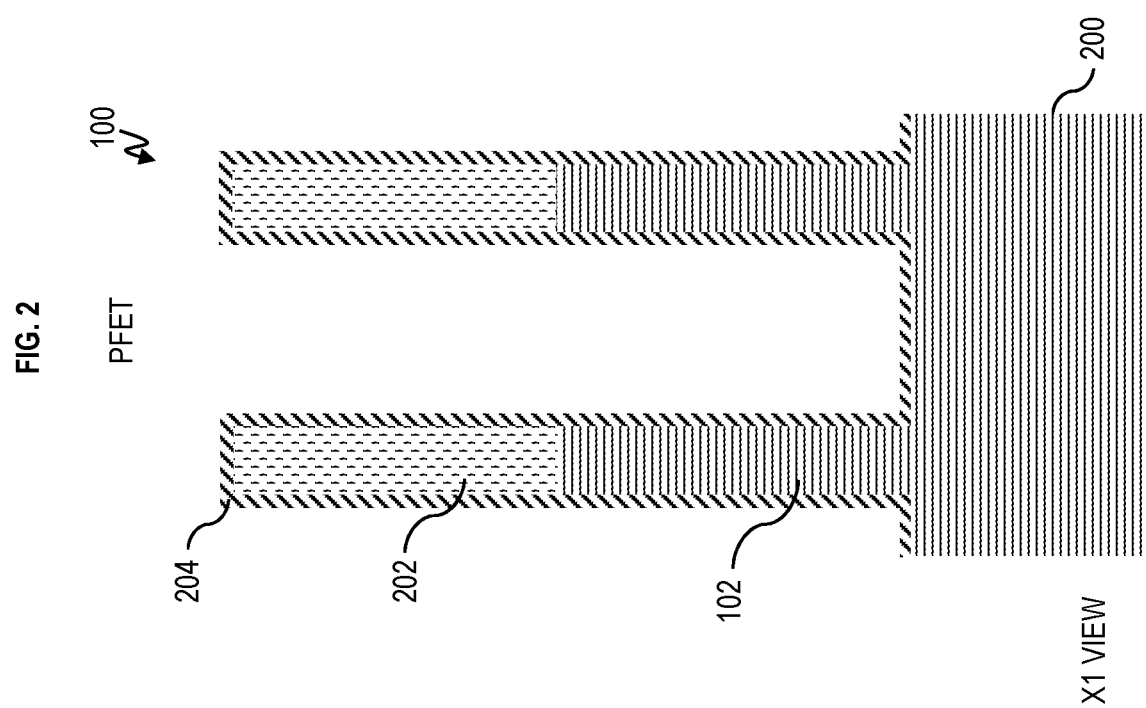

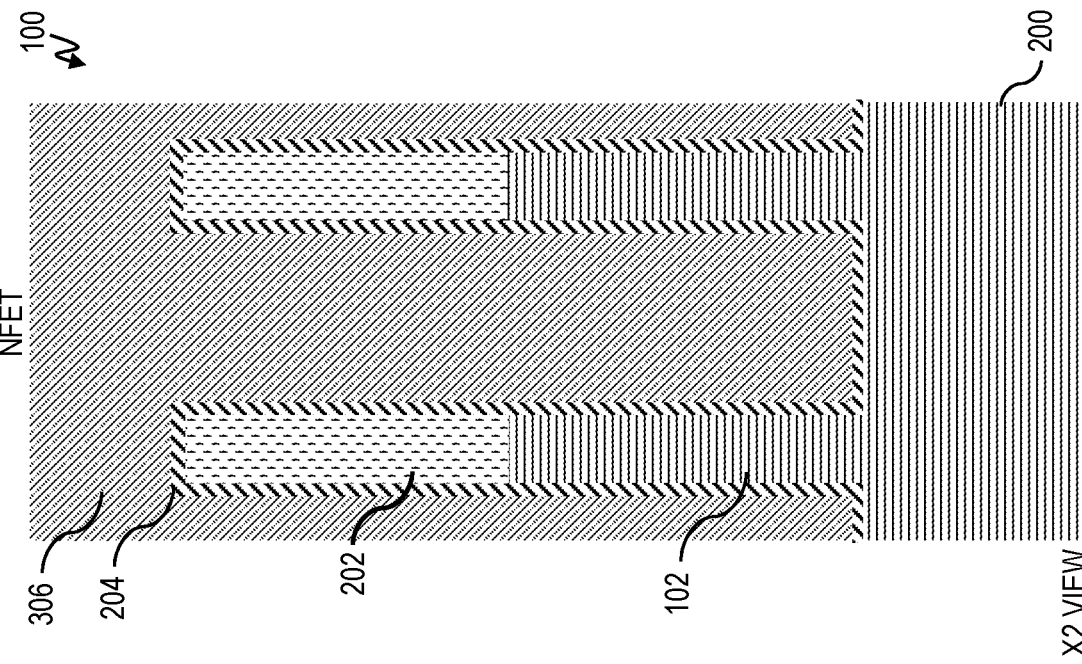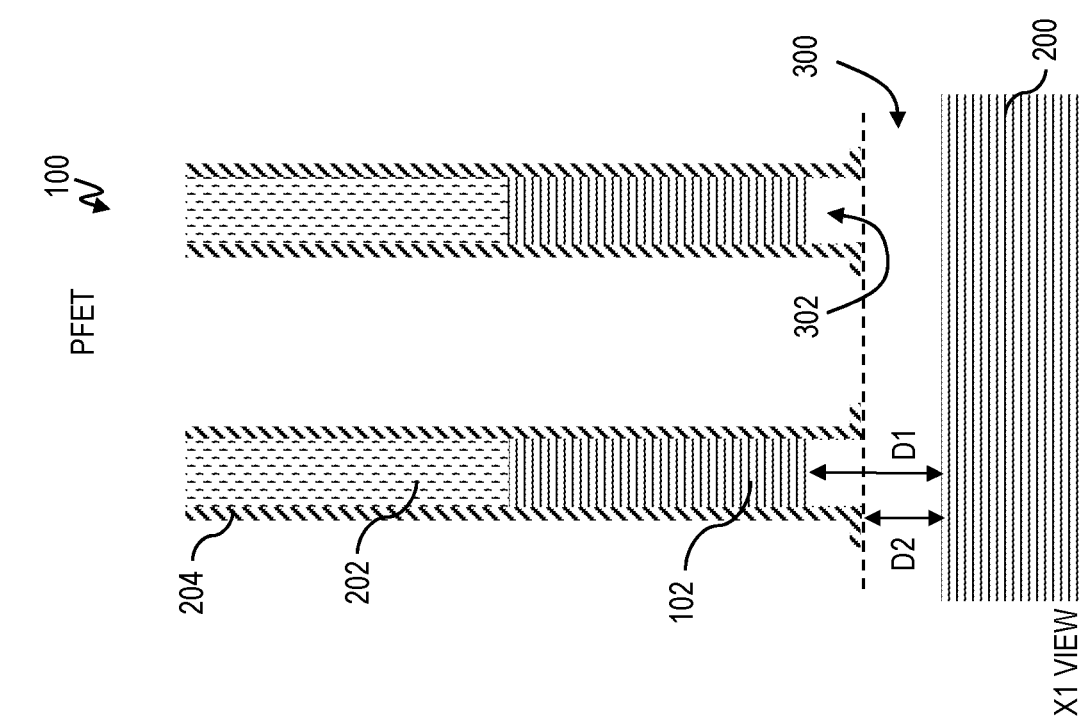

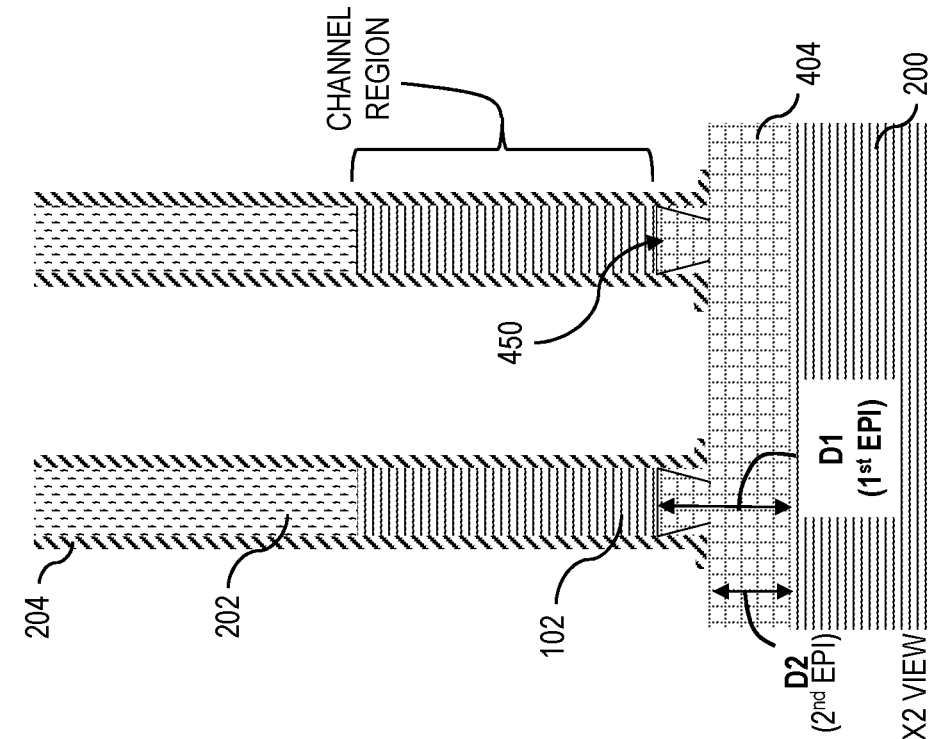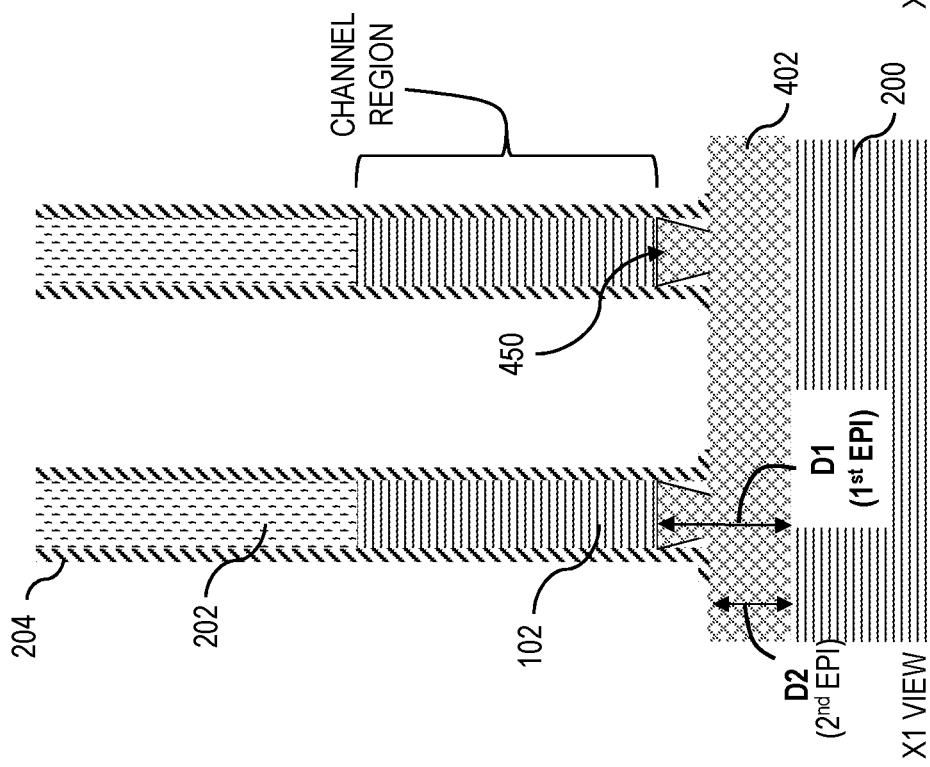

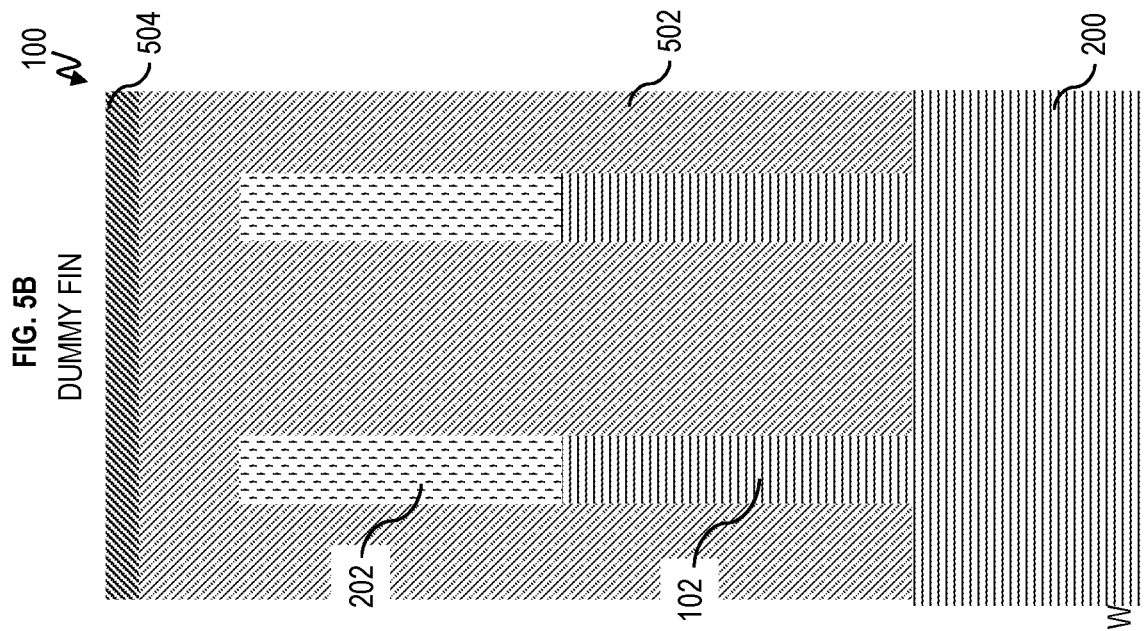
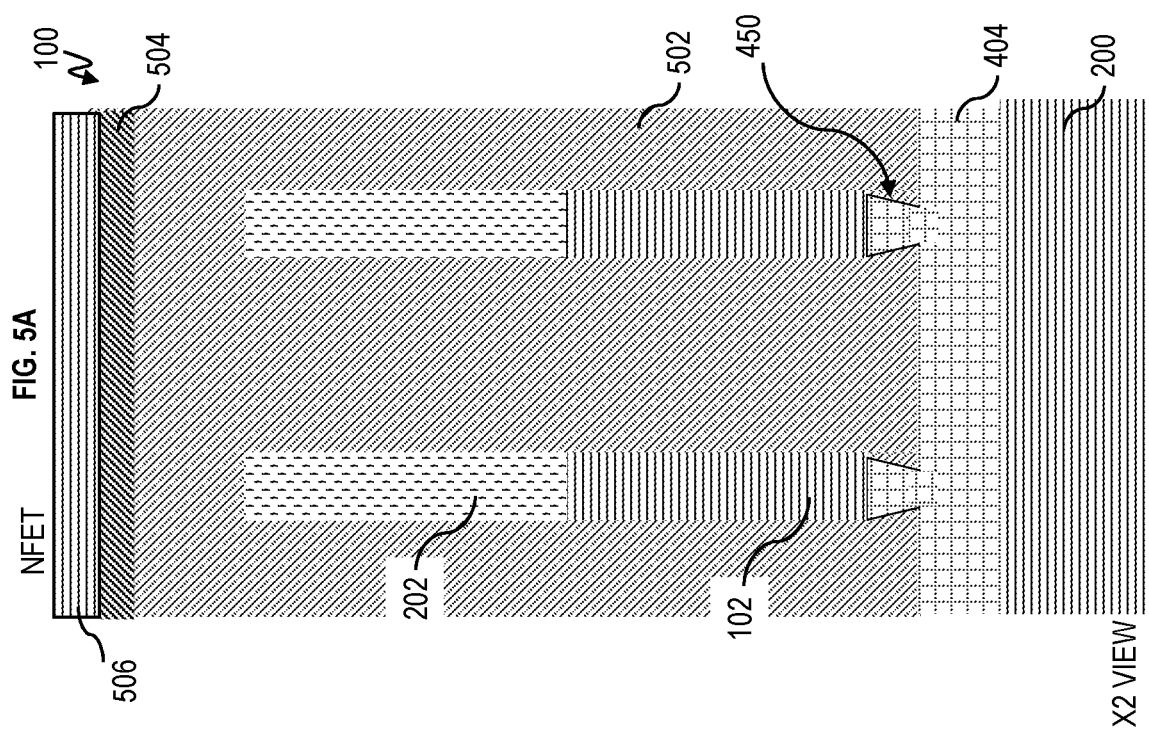

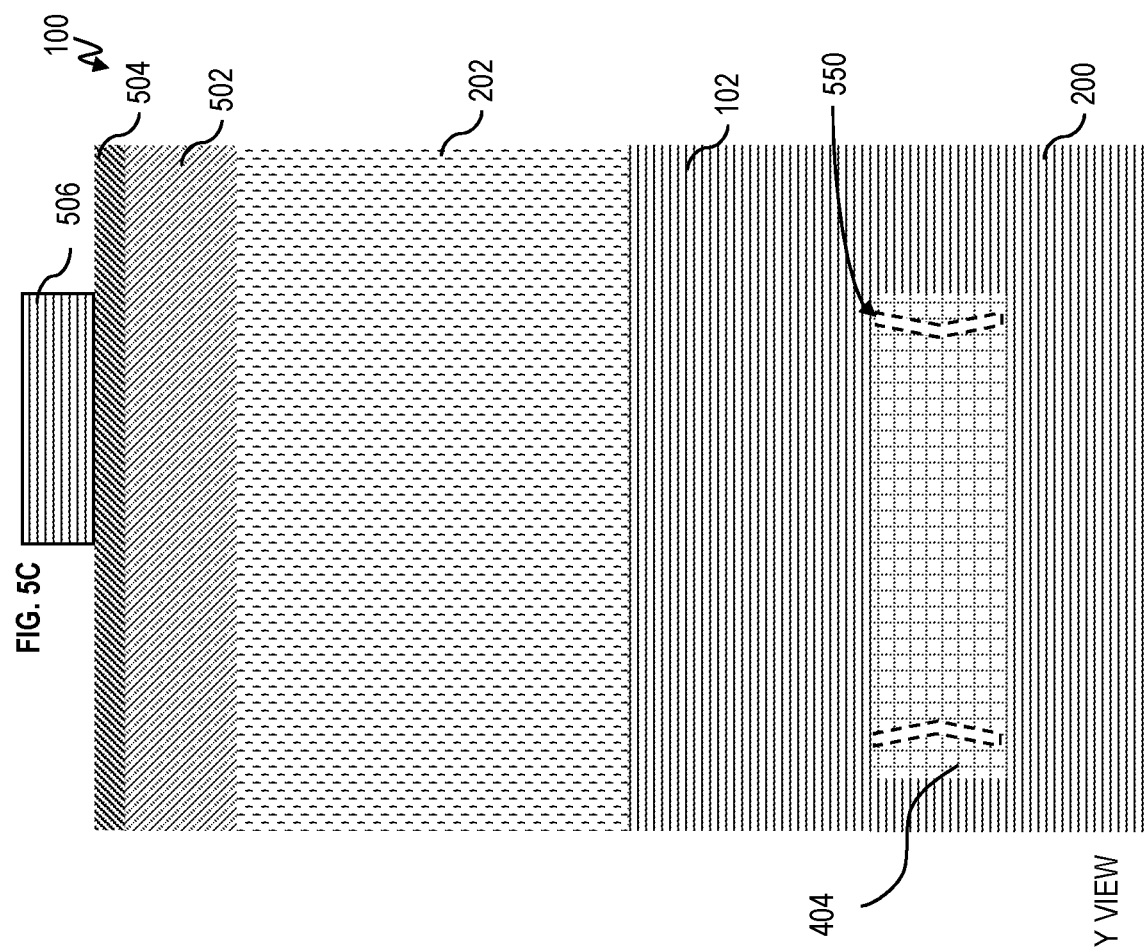

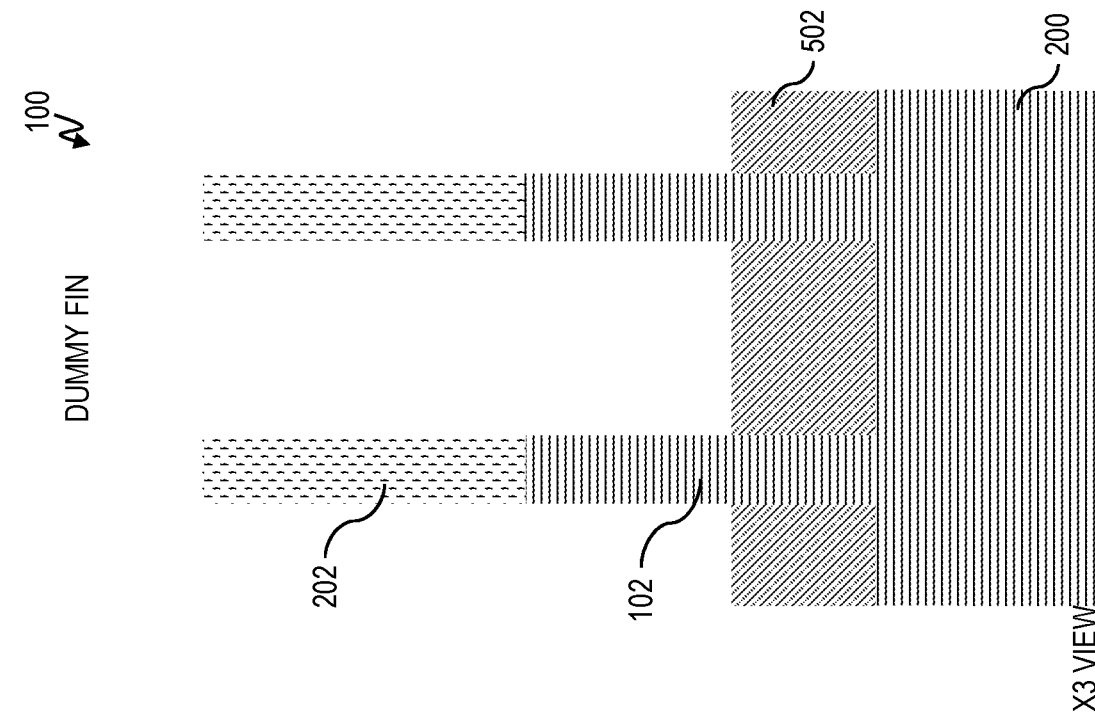
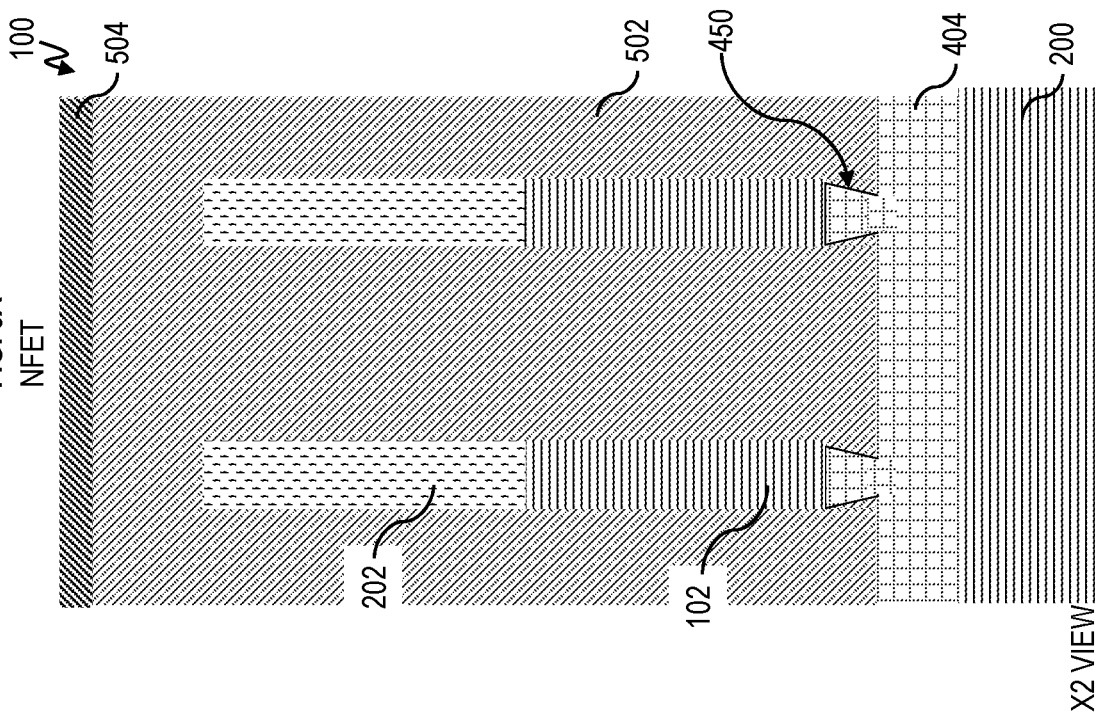

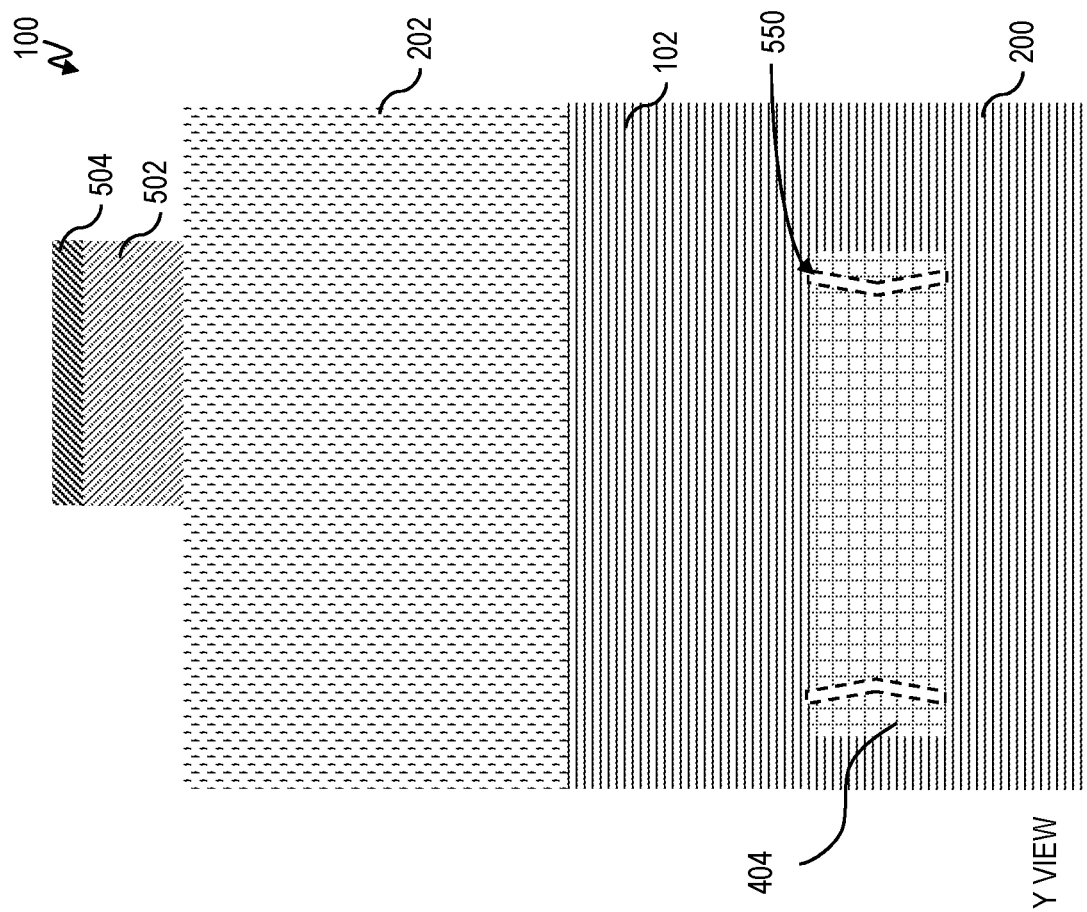

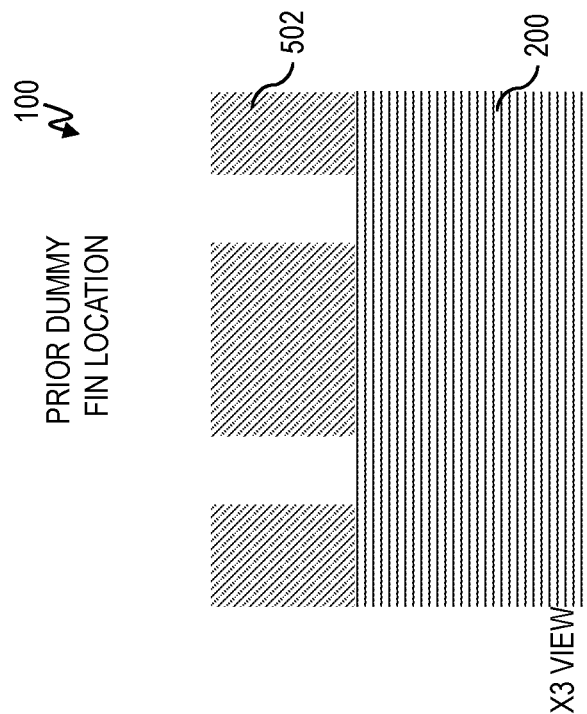
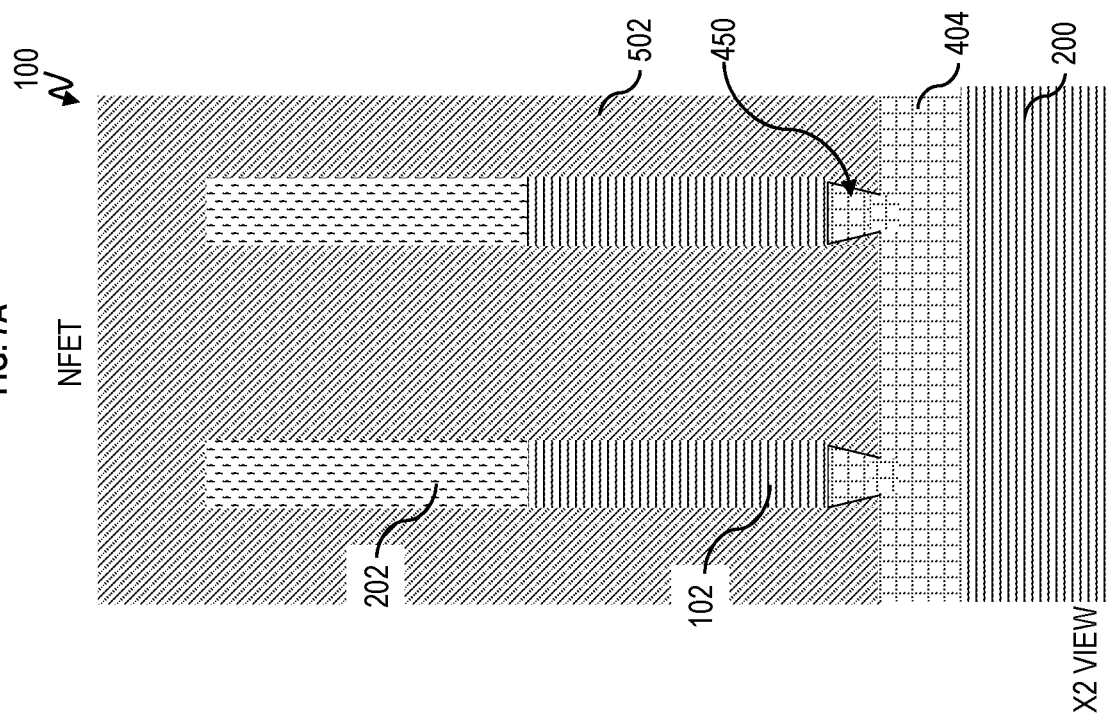

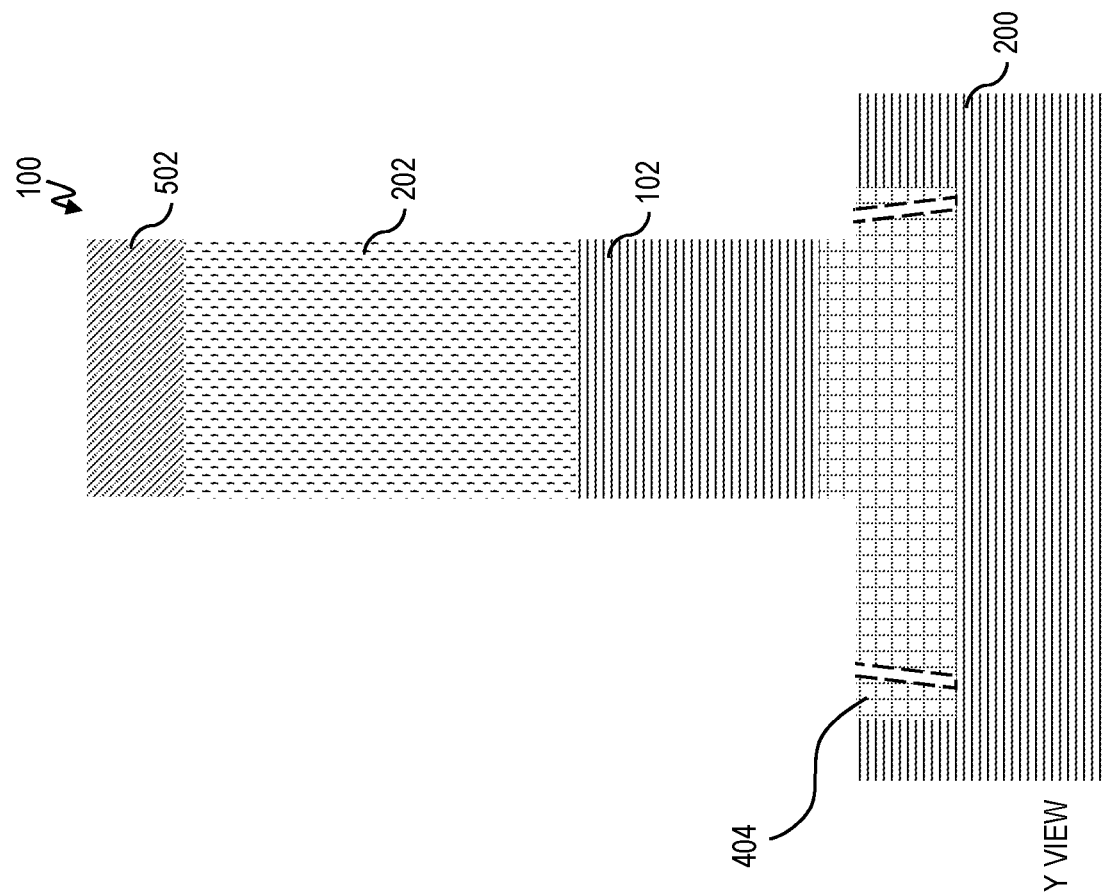

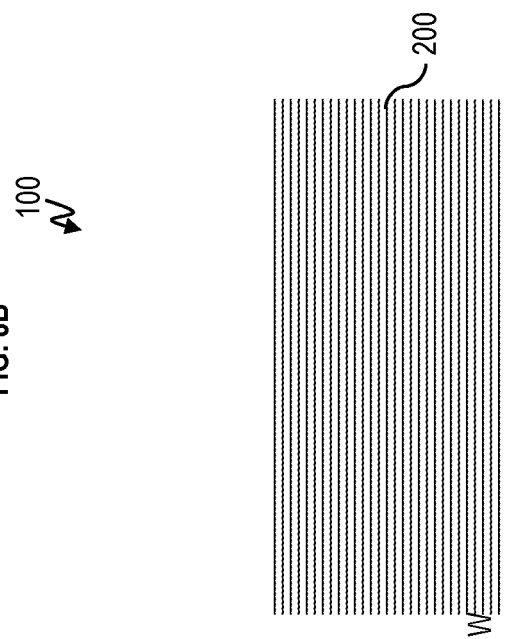
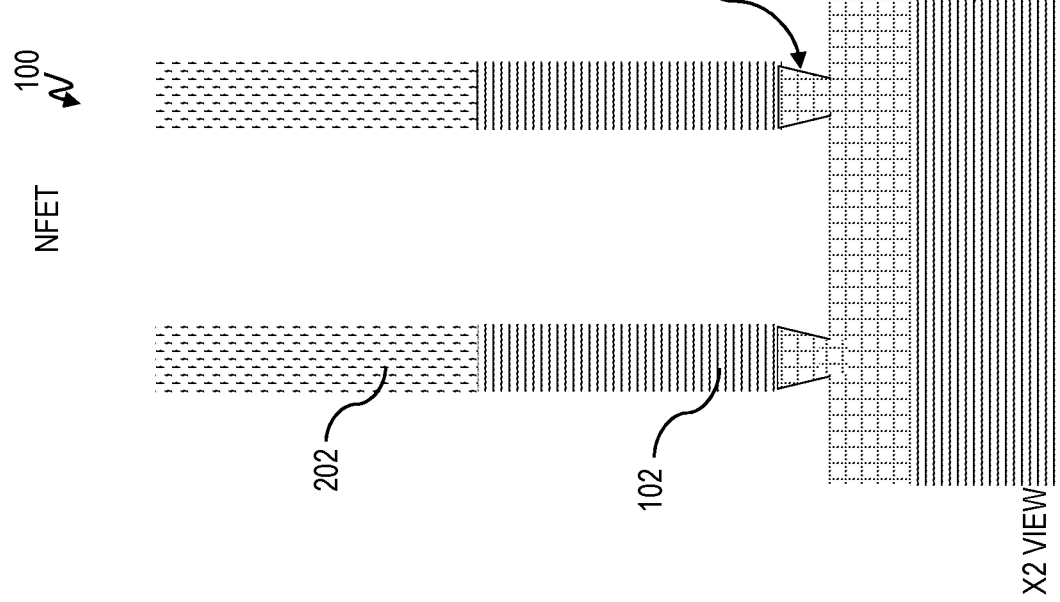

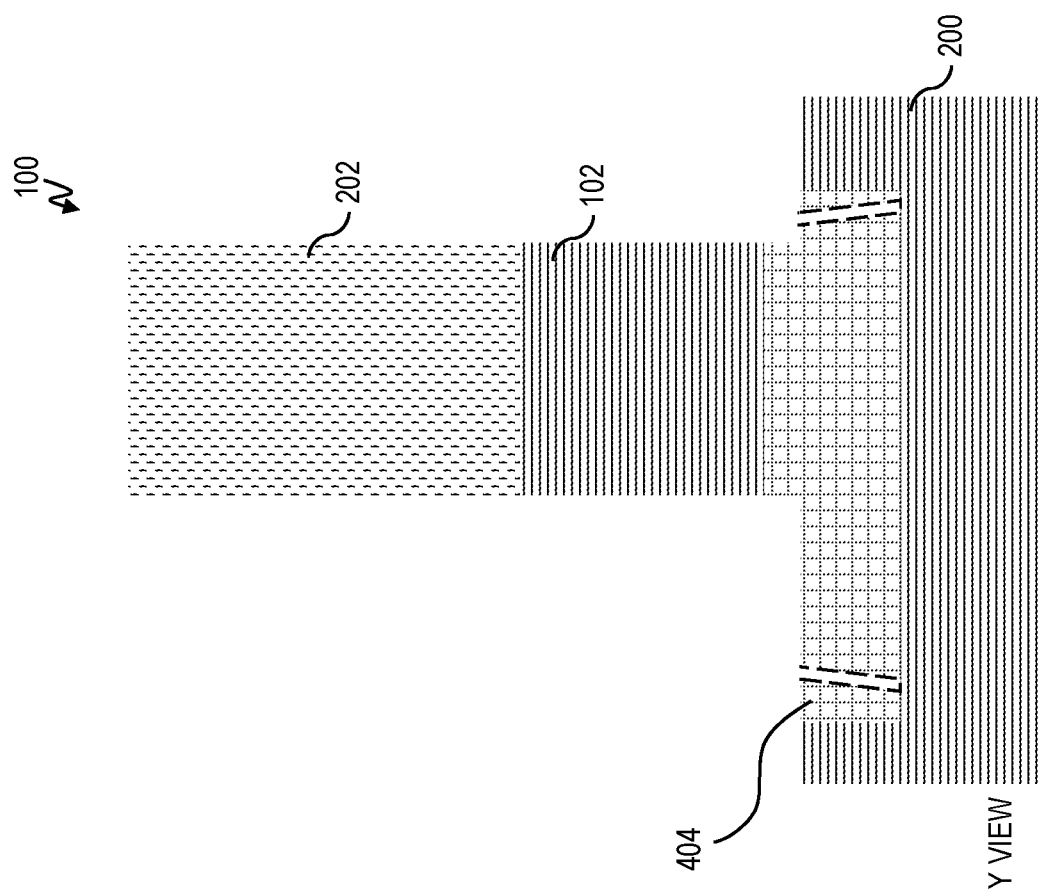

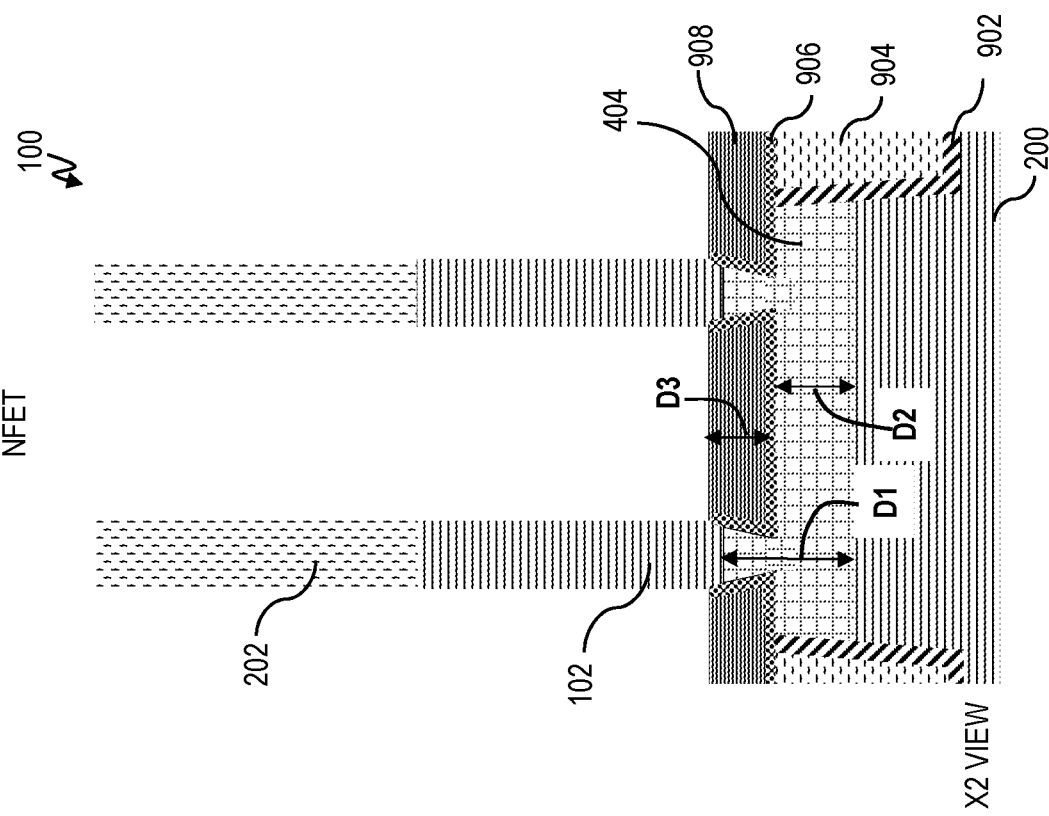

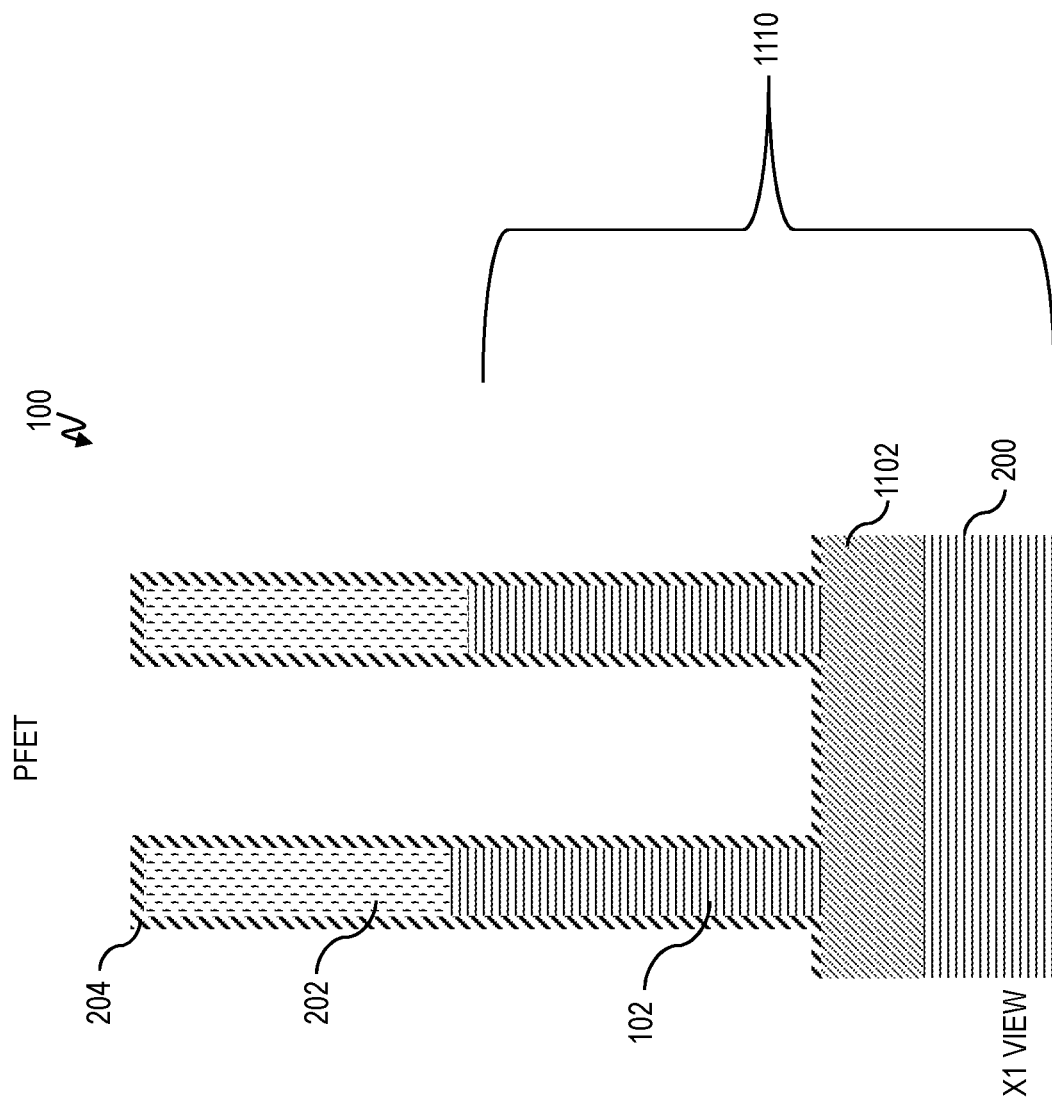

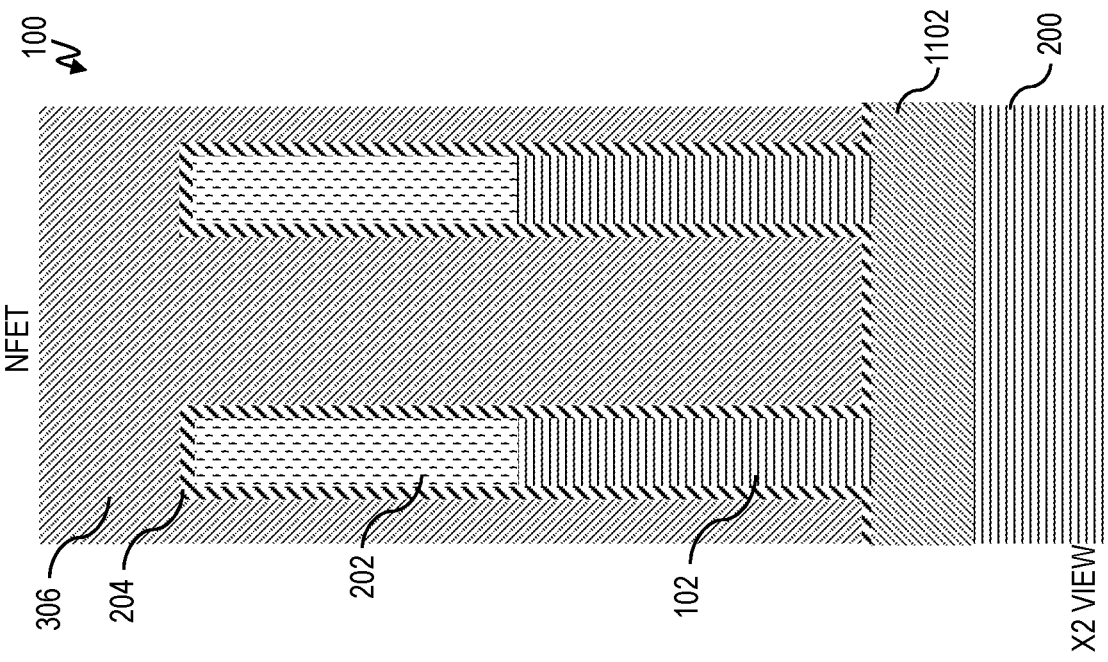
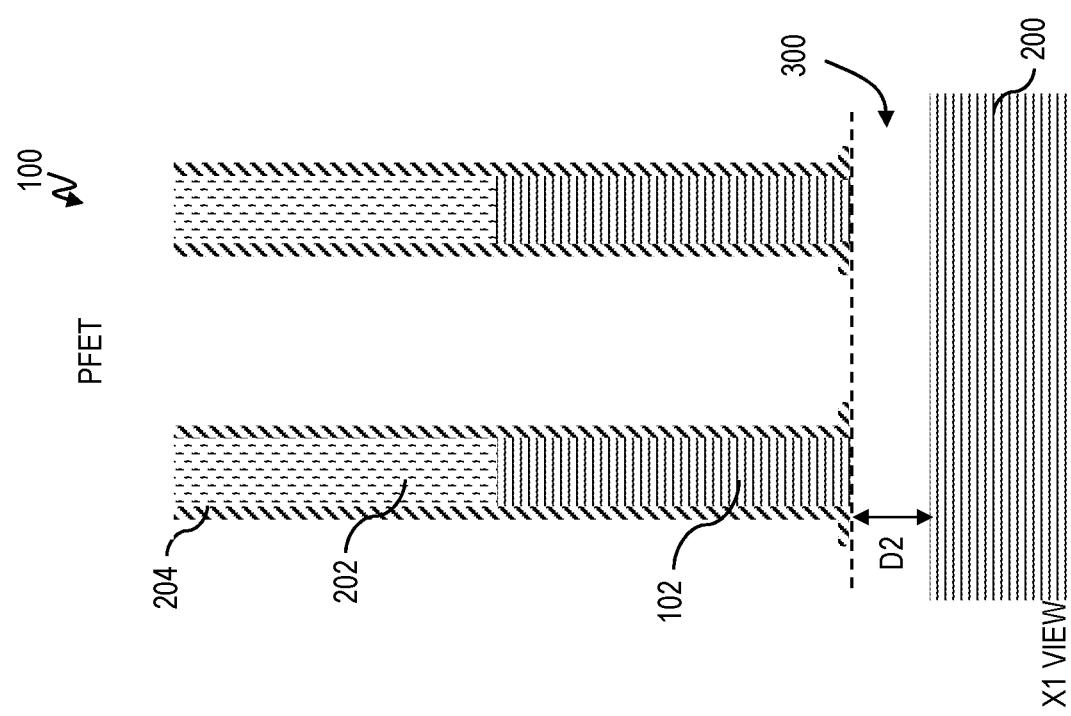

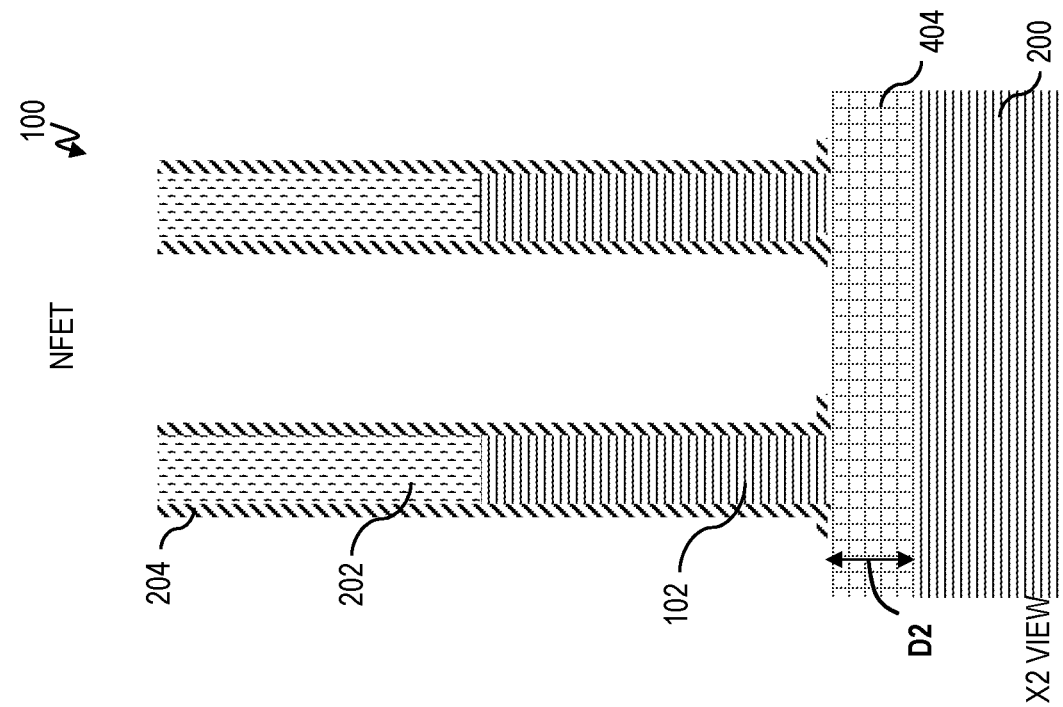
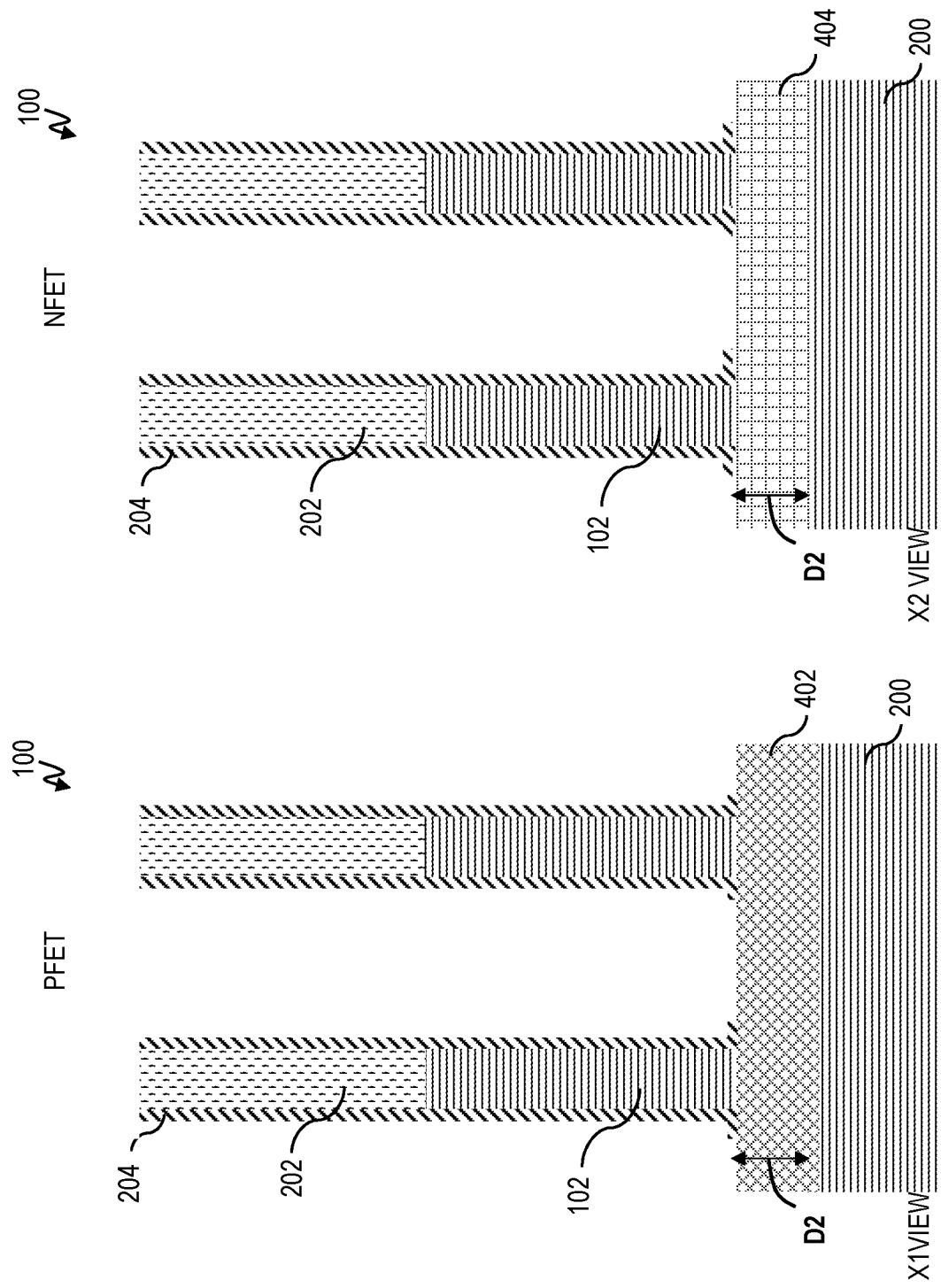

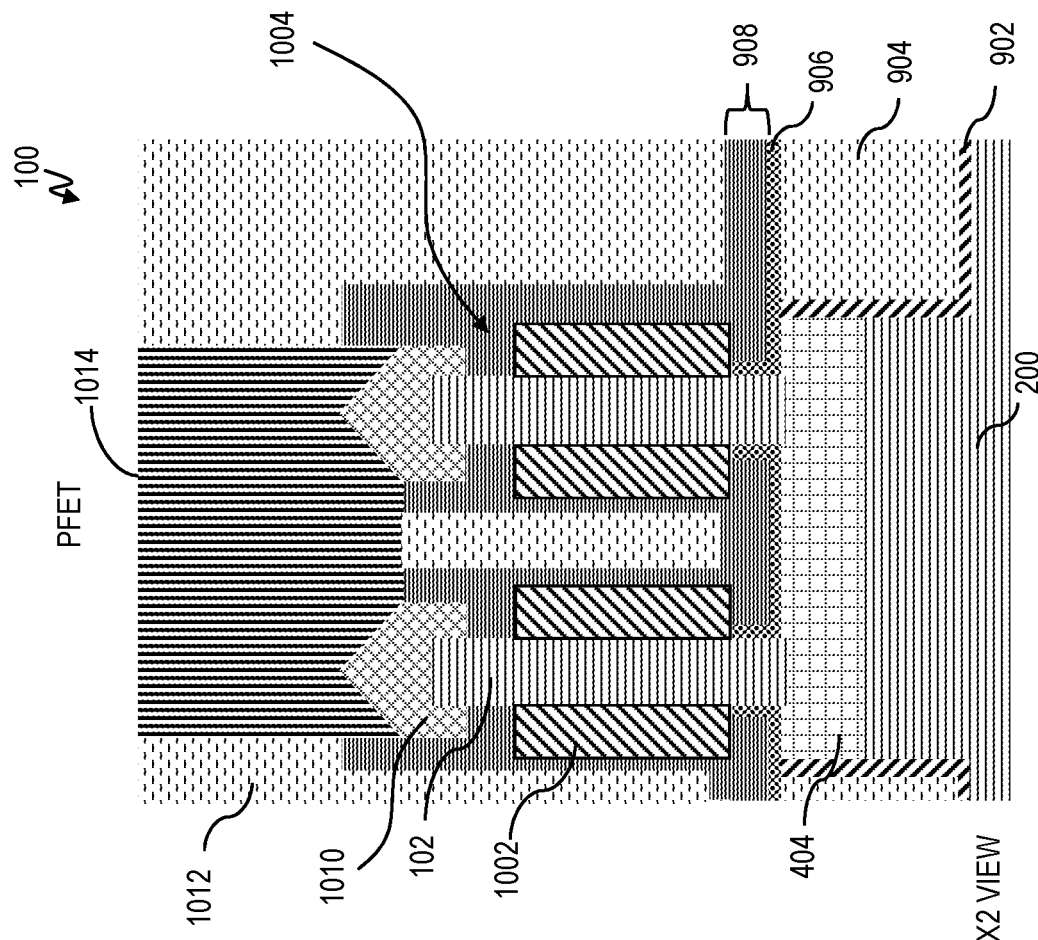

BOTTOM SOURCE/DRAIN ETCH WITH FIN-CUT-LAST-VTFET

BACKGROUND

The present invention generally relates to fabrication methods and resulting structures for semiconductor devices, and more specifically, to methods and resulting structures for bottom source/drain etching with a fin cut last process for vertical transport field effect transistors.

A metal-oxide-semiconductor field-effect transistor (MOSFET) is a transistor used for amplifying or switching electronic signals. The MOSFET has a source, a drain, and a metal oxide gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the path from drain to source is an open circuit ("off") or a resistive path ("on"). A fin-type field effect transistor (fin-FET) is a type of nonplanar MOSFET. FinFET devices include an arrangement of fins disposed on a substrate. The fins are formed from a semiconductor material. A gate stack is arranged over the fins and the portion of the fin that is under the gate defines a channel region of the fins, while regions of the fins that are not under the gate define active source and drain regions of the device. Various state-of-the-art techniques can be used for forming the fin.

Another nonplanar MOSFET that uses fin-shaped structures is a vertical FET. A vertical FET operates like a normal finFET that is horizontal. However, in a vertical FET (VFET) also referred to as a vertical transport field effect transistor (VTFET), the entire fin functions as the channel, and the source and drain regions are positioned at respective ends of the vertically positioned fin such that the current runs vertically from source to drain. Also, the gate of a VTFET usually wraps around the fin-shaped channel.

SUMMARY

A non-limiting example of a semiconductor device includes a first epitaxial material formed under a bottom surface of a set of fins, the first epitaxial material being under fin channel regions of the set of fins. The semiconductor device includes a second epitaxial material formed adjacent to the first epitaxial material and remote from the fin channel regions, a combination of the first epitaxial material and the second epitaxial material forming a bottom source or drain (source/drain) layer. Also, the semiconductor device includes a top source/drain layer formed on an upper portion of the set of fins, gate material being disposed around the set of fins between the top source/drain layer and the bottom source/drain layer.

A non-limiting example of a method for forming a semiconductor device includes forming a first epitaxial material under a bottom surface of a set of fins, the first epitaxial material being under fin channel regions of the set of fins. The method includes forming a second epitaxial material adjacent to the first epitaxial material and remote from the fin channel regions, a combination of the first epitaxial material and the second epitaxial material forming a bottom source/drain layer. Also, the method includes forming a top source/drain layer on an upper portion of the set of fins, gate material being disposed around the set of fins between the top source/drain layer and the bottom source/drain layer.

A non-limiting example of a method for forming semiconductor device includes forming a set of fins on a substrate, the set of fins and the substrate having a liner, the liner being patterned to expose at least part of the substrate. The method includes creating an opening underneath the set of fins by etching a portion of the substrate underneath the set of fins, and forming a source/drain layer in the opening.

A non-limiting example of a method for forming semiconductor device includes forming a set of fins on an insulator material, the insulator material being formed on a substrate, the set of fins and the insulator material having a liner, the liner being patterned to expose at least part of the insulator material. The method includes creating an opening underneath the set of fins by etching the insulator material underneath the set of fins, and forming a source/drain layer in the opening to be adjacent to the set of fins.

A non-limiting example of a semiconductor device includes a bottom source/drain layer formed under a bottom surface of a set of fins, the bottom source/drain layer including a raised portion immediately under the bottom surface of the set of fins. Also, the semiconductor device includes a top source/drain layer formed on an upper portion of the set of fins, gate material being disposed around the set of fins between the top source/drain layer and the bottom source/drain layer.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 1 depicts a simplified version of a top-down view of a semiconductor device according to one or more embodiments of the invention;

FIG. 2 depicts a cross-sectional view of the semiconductor device after fin formation according to one or more embodiments of the invention;

FIG. 3A depicts a cross-sectional view of the semiconductor device after direct bottom source/drain etch on the p-type FET (PFET) side according to one or more embodiments of the invention;

FIG. 3B depicts a cross-sectional view of the semiconductor device protecting the n-type FET (NFET) side according to one or more embodiments of the invention;

FIG. 4A depicts a cross-sectional view of the semiconductor device after formation of the bottom source/drain layer on the PFET side according to one or more embodiments of the invention;

FIG. 4B depicts a cross-sectional view of the semiconductor device after formation of the bottom source/drain layer on the NFET side according to one or more embodiments of the invention;

FIG. 5A depicts a cross-sectional view of the semiconductor device after formation of a lithograph stack according to one or more embodiments of the invention;

FIG. 5B depicts a cross-sectional view of the semiconductor device after formation of a lithograph stack according to one or more embodiments of the invention;

FIG. 5C depicts a cross-sectional view of the semiconductor device after formation of a lithograph stack according to one or more embodiments of the invention;

FIG. 6A depicts a cross-sectional view of the semiconductor device after patterning in preparation for the fin cut according to one or more embodiments of the invention;

FIG. 6B depicts a cross-sectional view of the semiconductor device after patterning in preparation for the fin cut according to one or more embodiments of the invention;

FIG. 6C depicts a cross-sectional view of the semiconductor device after patterning in preparation for the fin cut according to one or more embodiments of the invention;

FIG. 7A depicts a cross-sectional view of the semiconductor device after the fin cut according to one or more embodiments of the invention;

FIG. 7B depicts a cross-sectional view of the semiconductor device after the fin cut according to one or more embodiments of the invention;

FIG. 7C depicts a cross-sectional view of the semiconductor device after the fin cut according to one or more embodiments of the invention;

FIG. 8A depicts a cross-sectional view of the semiconductor device after block mask removal according to one or more embodiments of the invention;

FIG. 8B depicts a cross-sectional view of the semiconductor device after block mask removal according to one or more embodiments of the invention;

FIG. 8C depicts a cross-sectional view of the semiconductor device after block mask removal according to one or more embodiments of the invention;

FIG. 9A depicts a cross-sectional view of the semiconductor device after formation of shallow trench isolation regions and a bottom spacer according to one or more embodiments of the invention;

FIG. 11 depicts a cross-sectional view of the semiconductor device after fin formation according to one or more embodiments of the invention;

FIG. 12A depicts a cross-sectional view of the semiconductor device after direct bottom source/drain etch on the PFET side according to one or more embodiments of the invention;

FIG. 12B depicts a cross-sectional view of the semiconductor device protecting the NFET side according to one or more embodiments of the invention;

FIG. 13A depicts a cross-sectional view of the semiconductor device after formation of the bottom source/drain layer on the PFET side according to one or more embodiments of the invention;

FIG. 13B depicts a cross-sectional view of the semiconductor device after formation of the bottom source/drain layer on the NFET side according to one or more embodiments of the invention;

FIG. 14A depicts a cross-sectional view of the semiconductor device after metallization according to one or more embodiments of the invention.

Figure 9B:
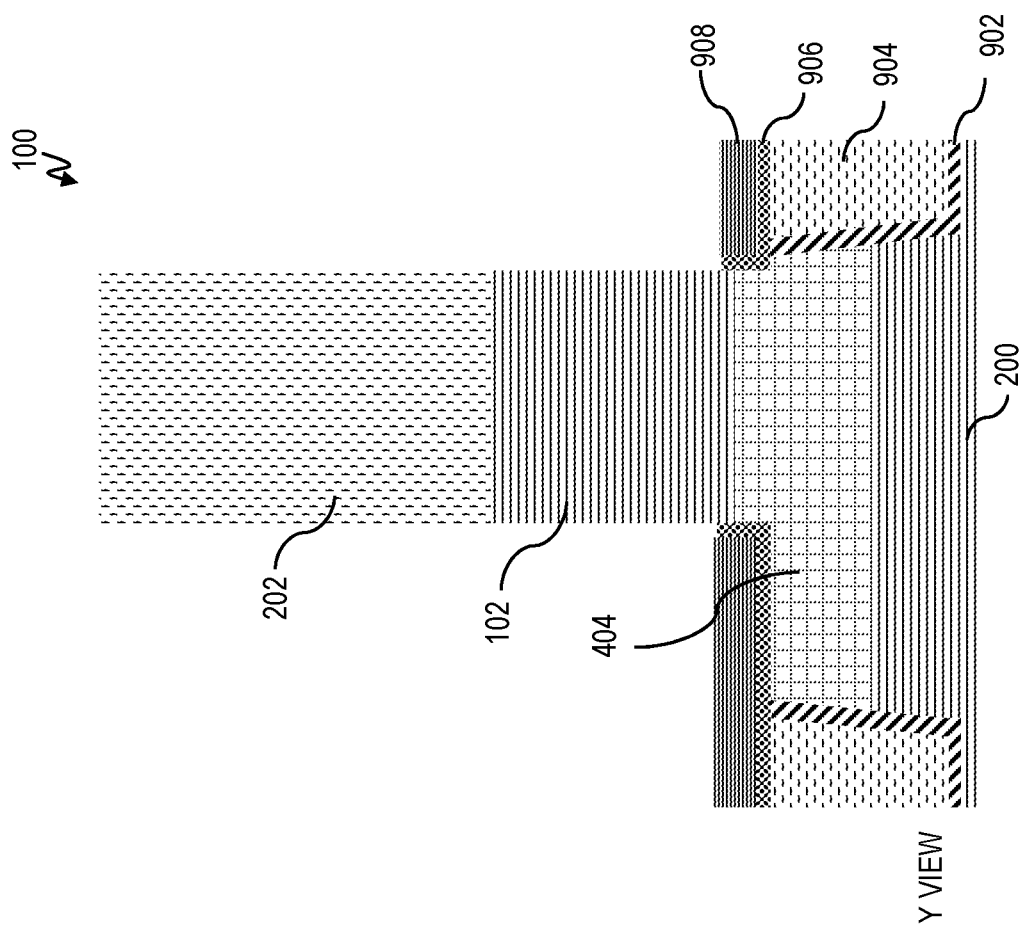
FIG. 9B depicts a cross-sectional view of the semiconductor device after formation of shallow trench isolation regions and a bottom spacer according to one or more embodiments of the invention.

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the embodiments of the invention, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

One or more embodiments of the invention provide fabrication methods and resulting structures for performing a direct bottom source or drain (source/drain) etch with a fin cut last process for vertical transport field effect transistors (VTFETs). In some embodiments of the invention, the direct bottom source/drain etch process is performed using a wafer, such as a silicon wafer or other type of semiconductor wafer. In one or more embodiments of the invention, the direct bottom source/drain etch process is performed using a silicon-on-insulator (SOI) wafer. The bottom source/drain also referred to as the bottom junction can be defined to be (directly) under the vertical channel (or vertical channel region) of the VTFET according to embodiments of the invention. The bottom source/drain is epitaxially grown under the vertical channel. As such, an abrupt junction is provided which does not require an extensive diffusion process as would be needed when the bottom source/drain is not directly under the vertical channel of the VTFET.

Turning now to a more detailed description of aspects of the present invention, FIG. 1 depicts a top-down view of a semiconductor device 100 according to one or more embodiments of the invention. FIG. 1 is a simplified diagram in which some layers have been omitted, so as not to obscure the figure and to illustrate layer(s) underneath. Example fins 102 are illustrated with future fin cut locations as dashed lines, and the future fin cuts (of dummy fins) occur as discussed herein. There can be n-type FETs (NFETs) and p-type FETs (PFETs) formed at various locations along the length of the fins 102. Although one NFET and PFET are shown in FIG. 1, it should be appreciated that additional transistors (e.g., NFETs and PFETs) are formed and/or concurrently being formed along the length of the fins 102 in both directions. Also, various illustrations of cross-sectional views are depicted along X1, X2, X3 and Y in FIG. 1 as discussed further below.

FIG. 2 depicts a cross-sectional view of the semiconductor device 100 taken along X1 according to one or more embodiments of the invention. A fin hardmask layer 202 is formed on the substrate 200. Reactive ion etching can be used to pattern the hardmask layer 202. The patterned hardmask layer 202 can be used as a mask to etch fins 102 in part of the substrate 200 using, for example, a reactive ion etch (RIE). The hardmask layer 202 can be a single layer or hardmask stack. Example materials for the hardmask layer 202 can include one or more layers of amorphous carbon, organo siloxane based materials, silicon nitride (SiN), silicon oxynitride (SiON), titanium nitride (TiN), etc. Example materials of the substrate 200 as well as the fins 102 can include silicon (Si), silicon germanium (SiGe), III-V semiconductors, etc. Dopants can be added to the fins 102 as desired to enhance carrier properties. The fins 102 can be described as vertical fins in which the entire fin functions as the vertical channel, and the source and drain regions are positioned at respective ends of the vertically positioned fin such that the current runs vertically from source to drain, thus forming a VTFET.

A liner 204 can be deposited on the fins 102, hardmask layer 202, and substrate 200. The liner 204 can include one or more layers. Example materials of the liner 204 can include oxide materials, nitride materials, and stacks of alternating layers of oxide materials and nitride materials. FIG. 2 shows example fabrication operations performed for the PFET at cross-sectional line X1. Although not shown, it is noted that analogous fabrication operations are performed for the NFET at cross-sectional line X2, along with other transistors on fins 102. At times, fabrication operations can be shown for the NFET side but not the PFET side (and vice versa), and these fabrication operations apply by analogy to the PFET side.

FIG. 3A depicts a cross-sectional view of the semiconductor device 100 taken along X1 according to one or more embodiments of the invention. FIG. 3B depicts a cross-sectional view of the semiconductor device 100 taken along X2 according to one or more embodiments of the invention. As seen in FIG. 3B, a block mask 306 is formed on the NFET side at cross-sectional line X2, and the block mask 306 protects the NFET from subsequent processing related to the PFET side. The block mask 306 can be a lithograph stack. The block mask 306 can include an organic planarization layer (OPL). The block mask 306 can include a hardmask or any protective polymer material.

In FIG. 3A, liner breakthrough is performed at the tops of the fin hardmask layer 202 and between fins 102 on the PFET side while the NFET side is protected. For example, etching is performed to remove the liner 204 from the tops of the fin hardmask layer 202, along with removing portions of liner 204 from in between the fins 102 and on the surface of the substrate 200. A RIE etch can be used. After etching, the hardmask layer 202 is exposed above the fins 102, and the portions of the substrate 200 are exposed.

Because of the exposed substrate 200, FIG. 3A illustrates that etching is performed to remove portions of the substrate 200 underneath the fins 102 to create opening 300 (or gap), and this etching can remove the footing of the fins 102. In one or more embodiments of the invention, the etching can stop at the bottom of liner 204 without undercutting the fins 102. In one or more embodiments of the invention, the etching can continue and etch a bottom portion or footings of the fins 102 which further creates gaps 302 as part of opening 300. The etch depth D2 is the distance from the top surface of the substrate 200 to the bottom surface of the liner 204, and the etch depth D1 is the distance from the bottom surface of the substrate 200 to the bottom surface of the fins 102. The difference in etch depth D1 and D2 is less than depth D2 (e.g., D1−D2<D2) which is to enable epitaxial growth to stop under the liner bottom of liner 204. In some cases, the top surface of the substrate 200 can be a flat profile after etching opening 300 or a wavy profile after etching opening 300. A dry etch can be utilized or a wet etch can be utilized in FIG. 3A, and the etch is intended to etch laterally and vertically. Further, during the etching to create opening 300, other regions of the fins 102 are protected by block masks 306 and these other regions are used as anchors to support the opening 300, thereby preventing the fin portions having openings 300 from falling/flopping over or collapsing. It should be appreciated that the fins 102 extend lengthwise beyond distance shown in FIG. 1.

FIG. 4A depicts a cross-sectional view of the semiconductor device 100 taken along X1 according to one or more embodiments of the invention. FIG. 4A illustrates formation of a bottom source/drain layer 402 in the opening 300 which includes gaps 302 if present. The gaps 302 contain raised portions 450 of bottom source/drain layer 402 in FIG. 4A (as well as raised portions 450 of bottom source/drain layer 404 depicted in FIG. 4B). In one or more embodiments of the invention, the raised portions 450 can be formed by epitaxial growth from the bottom of the fins 102 to have sloped sidewalls. For example, when material such as, for example, silicon germanium (SiGe) or another material, forming the bottom source/drain layer 404 has a different growth rate in one crystal plane versus another crystal plane, the sloped sidewalls can be in the (111) crystal plane of SiGe because SiGe grows faster in the [001] direction than [111] direction. The different growth rates can result in an inverted trapezoid shape for the raised portions 450 as depicted in FIG. 4A (and FIG. 4B), and in spaces 550 outlined with dashed lines for ease of understanding as depicted in FIGS. 5C and 6C. The downward epitaxial growth from the bottom surface of the fin 102 merges with the upward epitaxial growth from the substrate 200. In some trapezoid shapes of the raised portions 450, the wide base (e.g., at the top) abutting the bottom surface of fins 102 can have about the same width of both the gap 302 and the vertical fin 102 above while the short base (e.g., at the bottom) has a smaller width. As can be seen, the epitaxial material of the raised portion 450 does not fully fill gap 302, and the raised portion 450 does not have the same width of gap 302 at the bottom of the inverted trapezoid shape thereby leaving empty spaces. In one or more embodiments of the invention, the depth of gap 302 (shown in FIG. 3A) can be shallow, and the sloped sidewalls may not be apparent or even present.

In one or more embodiments of the invention, first epitaxial material of bottom source/drain layer 402 grows from both the fin bottom of fins 102 and the substrate 200, and second epitaxial material of bottom source/drain layer 402 grows (only) from the surface of substrate 200. Epitaxial growth of the first epitaxial material and second epitaxial material merges at a point below height D1 and D2 and will continue until the liner bottom of liner 204. The first and second epitaxial materials are the same. The bottom surface of bottom source/drain layer 402 can be flat or wavy, according to whether the top surface of the substrate 200 is flat or wavy. By ensuring that the difference of D1 and D2 is less than D2 (i.e., D1−D2<D2), this allows the epitaxial growth of bottom source/drain layer 402 to stop under the liner 204. In particular, the downward growth from the fin bottom of fins 102 meets the upward growth of bottom source/drain layer 402, such that growth continues to the liner bottom. In some embodiments of the invention, the gaps 302 are not formed as part of the opening 300 (i.e., no undercutting of fins 102), and accordingly, epitaxial growth of bottom source/drain layer 402 would (only) be upward from the substrate 200 to the bottom of liner 204; as well, depth D1 would be equal to D2 in such as case.

In FIG. 4A, the material of the bottom source/drain layer 402 is in accordance with the type of transistor being formed. Because FIG. 4A illustrates a PFET device, the bottom source/drain layer 402 is a semiconductor material doped with p-type dopants. When forming the NFET device, the bottom source/drain layer would be doped with n-type dopants (as depicted in FIG. 4B). Although not shown, it should be appreciated that the block mask 306 can be removed from the NFET side after opening the liner on the PFET side, and an OPL ash can be performed to remove the block mask 306 that protected NFET side in FIG. 3B. The subsequent epitaxial growth of bottom source/drain layer 402 does not occur on the NFET side, because the liner 204 still covers the substrate 200 and fins 102.

FIG. 4B depicts a cross-sectional view of the semiconductor device 100 taken along X2 according to one or more embodiments of the invention. Analogous to the fabrication processes discussed in FIGS. 3A, 3B, and 4A, these processes are repeated but switched for the PFET and NFET sides. For example, the PFET side having the bottom source/drain layer 402 formed is protected by the block mask (e.g., block mask 306) which is not shown. Analogous to FIG. 3A, the NFET side is etched to remove portions of the liner 204 above the hardmask layer 202 and between the fins 102, and etching continues on the NFET side to create an opening (e.g., opening 300 with and/or without gaps 302) not shown. Once the NFET side is etched, the block mask over the PFET side is removed.

As discussed for the PFET side in FIG. 4A, FIG. 4B illustrates formation of a bottom source/drain layer 404 for the NFET side in the opening (e.g., analogous to opening 300) which includes gaps (e.g., analogous to gaps 302) if present. In one or more embodiments of the invention, first epitaxial material of bottom source/drain layer 404 grows from both the fin bottom of fins 102 and the substrate 200, and second epitaxial material of bottom source/drain layer 404 grows (only) from the surface of substrate 200. As noted above, epitaxial growth of the first epitaxial material and second epitaxial material merges at a point lower than D1 and D2 and will continue until the liner bottom of liner 204 in FIG. 4B. In FIG. 4B, the bottom surface of the bottom source/drain layer 402 can be flat or wavy. By ensuring that the difference of D1 and D2 is less than D2 (i.e., D1−D2<D2), this allows the epitaxial growth of bottom source/drain layer 404 to stop under the liner 204. In FIG. 4B, the downward growth from the fin bottom of fins 102 meets the upward growth of bottom source/drain layer 404, such that growth continues to the liner bottom. In FIG. 4B, the material of the bottom source/drain layer 404 is for an NFET device, and as such, the bottom source/drain layer 404 can be doped with n-type dopants.

Although FIGS. 5A, 5B, and 5C discussed below illustrate fin cut patterning for the NFET side, the fin cut patterning and fin cut are analogously performed for the PFET side (not shown). FIG. 5A depicts a cross-sectional view of the semiconductor device 100 taken along X2 for the NFET side according to one or more embodiments of the invention. FIG. 5B depicts a cross-sectional view of the semiconductor device 100 taken along X3 for the dummy fin according to one or more embodiments of the invention. FIG. 5C depicts a cross-sectional view of the semiconductor device 100 taken along Y for the NFET according to one or more embodiments of the invention. Although not shown, the liner 204 is stripped from PFET and NFET sides, and a wet etch or dry etch can be used. Fin cut patterning is performed by depositing a block mask 502 on the hardmask layer 202, fins 102, and bottom source/drain layer 404, depositing a hardmask layer 504 on the block mask 502, and depositing photoresist material 506 on the hardmask layer 504. Photoresist material at the dummy fin region is developed and removed as depicted in FIG. 5B, while FIG. 5A shows that the NFET side (as well as the PFET side) is still covered with photoresist material 506. FIG. 5C illustrates fin cut patterning for the NFET side along Y.

FIG. 6A depicts a cross-sectional view of the semiconductor device 100 taken along X2 according to one or more embodiments of the invention. FIG. 6B depicts a cross-sectional view of the semiconductor device 100 taken along X3 according to one or more embodiments of the invention. FIG. 6C depicts a cross-sectional view of the semiconductor device 100 taken along Y according to one or more embodiments of the invention. A partial etch of the block mask 502 is performed in accordance with the pattern of the photoresist material 506. For example, FIG. 5A previously illustrated that the hardmask layer 504 is protected by photoresist material 506, and accordingly, the NFET side is protected during the partial etch of block mask 502 in FIG. 6A. FIG. 6B shows the partial etch of block mask 502 which exposes dummy fins 102 and hardmask layer 202. The partial etch ensures that part of the block mask 502 is still on the surface of the substrate 200 between fins 102 at the dummy fin region, which is preparation for the fin cut. In preparation for further processing, FIG. 6B illustrates the partial etch of block mask 502 so that only the dummy fins will be etched (as seen in FIG. 7B) but material between dummy fins will not be etched. FIG. 6C shows a partial etch of block mask 502 according to the pattern of hardmask layer 504 which exposes hardmask layer 202.

FIG. 7A depicts a cross-sectional view of the semiconductor device 100 taken along X2 for the NFET side according to one or more embodiments of the invention. FIG. 7B depicts a cross-sectional view of the semiconductor device 100 taken along X3 for the previous location of dummy fins according to one or more embodiments of the invention. FIG. 7C depicts a cross-sectional view of the semiconductor device 100 taken along Y for the NFET according to one or more embodiments of the invention. The fin cut has been performed. For example, the photoresist material 506 is removed, and the block mask 502 protects layers underneath. Accordingly, the NFET side (analogously the PFET side) remains protected by block mask 502 covering hardmask layer 504 and fins 102 (from FIG. 6A). Therefore, after performing the fin cut, FIG. 7A shows hardmask layer 202 and fins 102 remaining on the NFET side (analogous to the PFET side). FIG. 7B shows that dummy fins 102 and hardmask layer 202 have been removed during the fin cut after having been previously left exposed in FIG. 6B. Resulting from fabrication processes performed on FIG. 6C, the pattern of block mask 502 is continued during the etching of the fin cut as depicted in FIG. 7C. Particularly, FIG. 7C illustrates that unprotected parts of the hardmask layer 202, fin 102, and bottom source/drain layer 404 have been etched during the fin cut.

After performing the fin cut, FIG. 8A depicts a cross-sectional view of the semiconductor device 100 taken along X2 for the NFET side according to one or more embodiments of the invention. FIG. 8B depicts a cross-sectional view of the semiconductor device 100 taken along X3 for the previous location of dummy fins according to one or more embodiments of the invention. FIG. 8C depicts a cross-sectional view of the semiconductor device 100 taken along Y for the NFET according to one or more embodiments of the invention. After the fin cut, any remaining portions of the block mask 502 and hardmask layer 504 are removed.

According to one or more embodiments of the invention, it should be appreciated that the bottom source/drain layers 402, 404 for the PFET and NFET sides, respectively, have been formed directly underneath the fins 102 prior to the fin cut, as can be seen in FIGS. 4A and 4B. This means that the bottom source/drain layer is directly under the vertical channel regions, where the entire vertical fin functions as the channel through which current runs vertically between source and drain. Further, fabrication operations can be performed to complete the PFET and NFET as understood by one skilled in the art, and methods to complete the VTFETs are not meant to be limited.

FIG. 9A depicts a cross-sectional view of the semiconductor device 100 taken along X2 for the NFET side according to one or more embodiments of the invention. FIG. 9B depicts a cross-sectional view of the semiconductor device 100 taken along Y for the NFET side according to one or more embodiments of the invention. Analogous fabrication operations discussed in FIGS. 9A and 9B for the NFET side are performed for the PFET side, although not shown. Active transistor regions are defined by creating shallow trench isolation regions. For example, trenches for shallow trench isolation (STI) regions are formed, and spacer material 902 can be formed to line the STI trenches. The spacer material 902 can be an oxide or nitride material. Examples of the spacer material 902 can include porous SiCN, SiCOH, and octamethylcyclotetrasiloxane (OMCTS). In some embodiments of the invention, a liner can be formed as an intervening layer between the spacer material 902 and the trench walls. STI material 904 is formed in the STI trenches. The STI material 904 can be a low-k dielectric material. The STI material 904 can be an oxide, such as, for example silicon dioxide. The dielectric constant (k) of the low-k dielectric material can be equal to or less than about 3.0 in one or more embodiments of the invention. Further, the dielectric constant (k) of the low-k dielectric material can be equal to or less than about 3.7 or 3.9 in one or more embodiments of the invention.

As seen in FIGS. 9A and 9B, a bottom spacer layer 908 can be formed on the bottom source/drain layer 404. The bottom spacer layer 908 can be an oxide, a nitride, etc. In one or more embodiments of the invention, the bottom spacer layer 908 can include the same materials used for spacer material 902. In one or more embodiments of the invention, a liner 906 can be formed as an intervening layer between the bottom spacer layer 908 and the bottom source/drain layer 404. As depicted in FIG. 9A, a depth/height D3 is the height between the liner 906 and the top surface of the bottom spacer layer 908 if the liner 906 is present. Also, the depth/height D3 is the height between the top surface of the bottom source/drain layer 404 and the top surface of the bottom spacer layer 908 when the liner 906 is not present. In one or more embodiments of the invention, the combination of D3 and D2 is greater than D1 (e.g., D3+D2>D1), which avoids the gate stack from being too close to bottom source/drain layer 404 (or 402) and enables a smaller capacitance and less leakage current for the VTFET than the process of record.

Figure 10A:
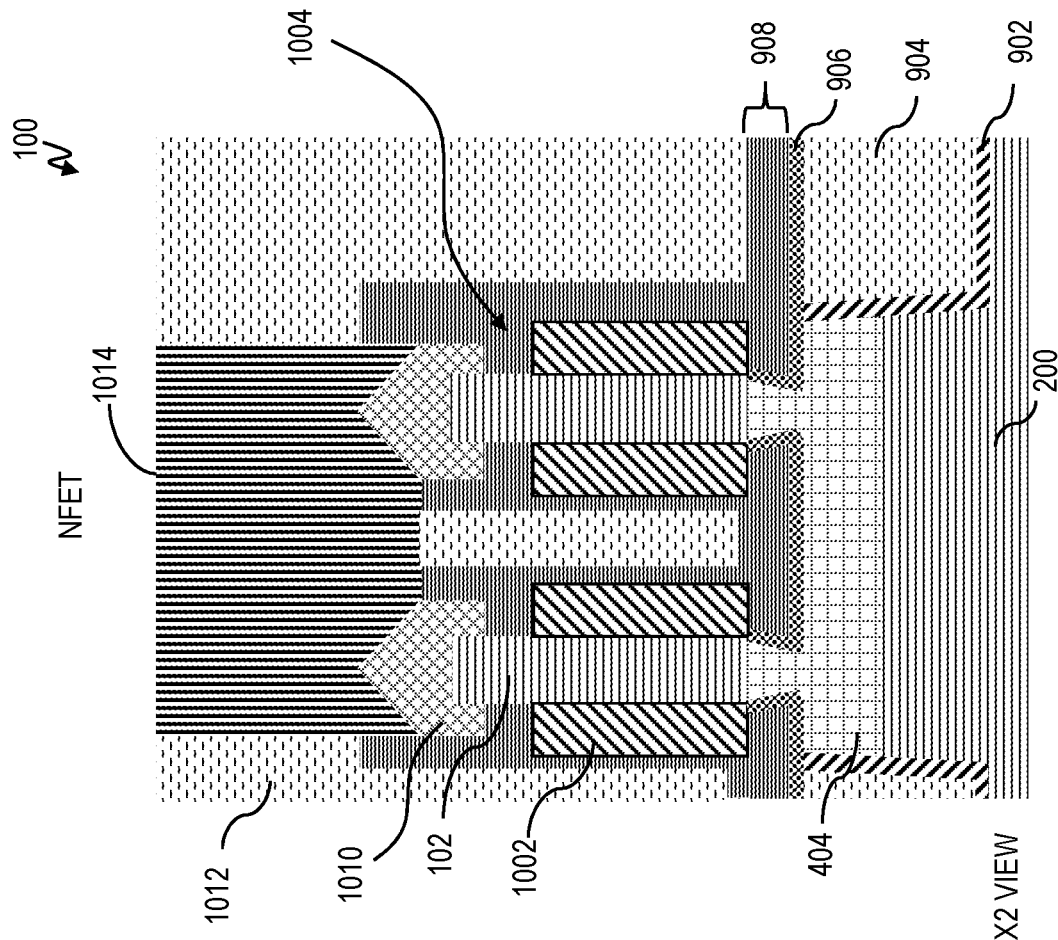
FIG. 10A depicts a cross-sectional view of the semiconductor device after metallization according to one or more embodiments of the invention.
Figure 10B:
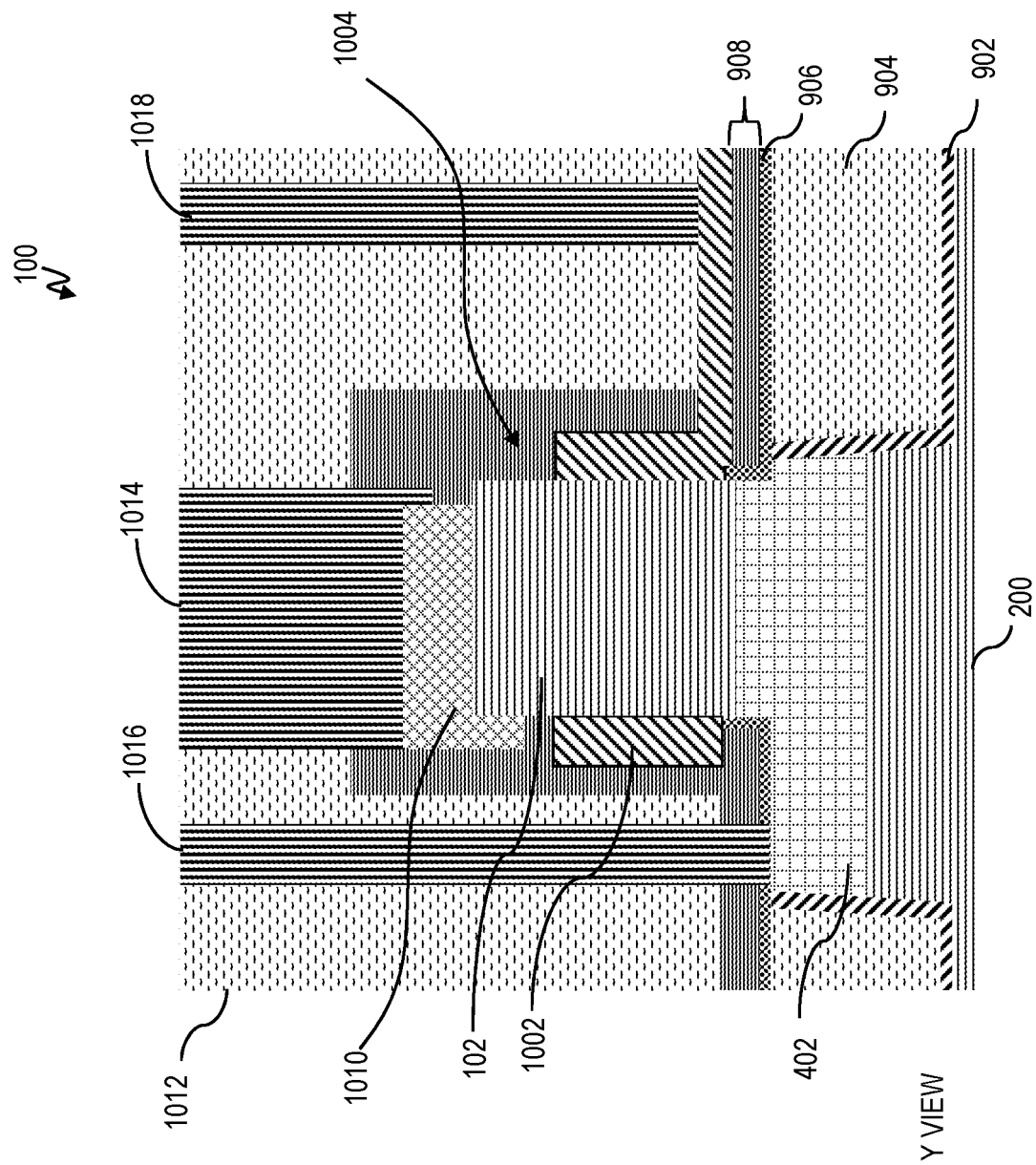
FIG. 10B depicts a cross-sectional view of the semiconductor device after metallization according to one or more embodiments of the invention.

FIG. 10A depicts a cross-sectional view of the semiconductor device 100 taken along X2 for the NFET side according to one or more embodiments of the invention. FIG. 10B depicts a cross-sectional view of the semiconductor device 100 taken along Y for the NFET side according to one or more embodiments of the invention. Analogous fabrication operations discussed in FIGS. 10A and 10B for the NFET side are performed for the PFET side, although not shown.

As seen in FIGS. 10A and 10B, gate material 1002 is formed to surround fins 102. The gate material 1002 can include a gate stack formed of a high-k dielectric material formed on the fins 102 and a workfunction material formed on the high-k dielectric material. In one or more embodiments of the invention, the high-k dielectric material can have a dielectric constant greater than the dielectric constant of silicon dioxide (i.e., greater than 3.7-3.9). Examples of high-k dielectric materials include, but are not limited to, hafnium (Hf)-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). The workfunction material includes a work function suitable for enhancing the electrical properties of n-type or p-type semiconductor devices depending on the type of transistor being formed.

Top spacer layers 1004 are formed on top of the gate material 1002. The top spacer layers 1004 can be a low-k dielectric material and can include materials used for the bottom spacer layer 908. Top source/drain layers 1010 are formed on top of fins 102. The top source/drain layers 1010 can be epitaxial material grown from the fins 102. The top source/drain layer 1010 can be a semiconductor material doped with p-type dopants or n-type dopants depending on the type of transistor being formed. Inter-layer dielectric or inter-level dielectric (ILD) material 1012 is deposited and CMP to certain level. The ILD material 1012 can include dielectric materials having a dielectric constant (k) equal to or less than about 2.5 or equal to or less than about 2.0 in one or more embodiments of the invention. Trenches for the top source/drain contact, bottom source/drain contact, and gate contact can be formed in preparation for metallization. Metallization is performed to form top source/drain contact 1014 on top of the top source/drain layer 1010 in FIGS. 10A and 10B. Also, bottom source/drain contact 1016 is formed on top of the bottom source/drain layer 402, and gate contact 1018 is formed on gate material 1002. Example materials used for metallization can include copper, aluminum, tungsten, tungsten cobalt, ruthenium, nickel, etc.

As discussed herein, one or more embodiments apply to silicon-on-insulator (SOI) wafers and/or semiconductor wafers. FIGS. 11-14B discussed below are analogous to FIGS. 1-9B previously discussed, but apply to SOI wafers. For the sake of conciseness, some details are omitted in the discussion of FIGS. 9-12B and reference can be made back to discussions of FIGS. 1-9B.

FIG. 11 depicts a cross-sectional view of the semiconductor device 100 taken along X1 for the PFET side according to one or more embodiments of the invention. Analogous fabrication processes are performed for the NFET side, although FIG. 11 shows the PFET side. An SOI wafer 1110 initially includes an insulator layer 1102 formed on the substrate 200, and top substrate material formed on top of the insulator layer 1102. The hardmask layer 202 is deposited on SOI wafer 1110 and is patterned as discussed herein. Using the patterned hardmask layer, fins 102 are formed in the top substrate material using the patterned hardmask layer 202 as a mask as discussed herein. Additionally, etching the fins 102 is performed with selectivity to the substrate material of fins 102 and not to the insulator layer 1102 (e.g., oxide), thereby preventing fin footing generation. After forming fins 102, the liner 204 is formed on the hardmask layer 202 and fins 102 as well as the top surface of the insulator layer 1102, as depicted in FIG. 11. The top substrate material of fins 102 and the substrate 200 can be the same material or different materials.

FIG. 12A depicts a cross-sectional view of the semiconductor device 100 taken along X1 for the PFET side according to one or more embodiments of the invention. FIG. 12B depicts a cross-sectional view of the semiconductor device 100 taken along X2 according to one or more embodiments of the invention. FIG. 12A illustrates formation of opening 300 as discussed above, with the exception of undercutting the fins 102 which resulted in gaps 302 in FIG. 3A.

For example, FIG. 12B illustrates that block mask 306 is formed on the NFET side at cross-sectional line X2, and the block mask 306 protects the NFET from subsequent processing (as discussed in FIG. 3B). Referring to FIG. 12A, liner breakthrough is performed at the tops of the fin hardmask layer 202 and between fins 102, such that tops of hardmask layer 202 are exposed above the fins 102 and the portions of the substrate 200 are exposed (as discussed in FIG. 3A). As the NFET side is protected in FIG. 12B, FIG. 12A illustrates insulator recess of insulator layer 1102 to create opening 300 with depth D2 underneath fins 102 without undercutting the fins 102 (i.e., without etching into the fins 102). Etching the insulator layer 1102 in FIG. 12A does not create gaps 302 shown in FIG. 3A. The insulator layer 1102 can be an oxide material, and the oxide etch chemistry is selective to the oxide material of insulator layer 1102, such that fin material of fins 102 (e.g., silicon) is not etched and there will be no undercutting into the bottom surface of the (silicon) fins 102. A dry etch can be utilized or a wet etch can be utilized in FIG. 12A, and the etch is intended to etch laterally and vertically to create opening 300.

FIG. 13A depicts a cross-sectional view of the semiconductor device 100 taken along X1 on the PFET side according to one or more embodiments of the invention. FIG. 13A illustrates formation of bottom source/drain layer 402 in the opening 300. For example, once opening 300 has been created for the PFET side, first epitaxial material of bottom source/drain layer 402 grows from both the fin bottom surface of fins 102 and the substrate 200, and second epitaxial material of bottom source/drain layer 402 grows (only) from the surface of substrate 200. Epitaxial growth of the first epitaxial material and second epitaxial material merges at a point below D2 and will continue until reaching the liner bottom of liner 204. In cases were the epitaxial growth of bottom source/drain layer 402 is uneven, the epitaxial material can be reflowed at high temperature using hydrogen ($H_2$) to create a flat top epitaxial surface.

FIG. 13B depicts a cross-sectional view of the semiconductor device 100 taken along X2 on the NFET side according to one or more embodiments of the invention. FIG. 13B illustrates formation of bottom source/drain layer 404 in the opening (e.g., analogous to opening 300). Analogous to the fabrication processes discussed in FIGS. 12A and 12B, these processes are repeated but switched for the PFET and NFET sides such that NFET side is formed with a respective opening like opening 300. After forming bottom source/drain layer 402 for the PFET side in FIG. 13A, liner 204 can be redeposited on hardmask layer 202 and newly formed bottom source/drain layer 402 on the PFET side, and protective block mask 306 is formed on the PFET side (analogous to the NFET side shown in FIG. 12B). Analogous to the fabrication processes discussed in FIG. 12A, these processes are now performed for the NFET side. For example, once the PFET side having the bottom source/drain layer 402 is protected by the block mask (e.g., block mask 306), the NFET side is etched to remove portions of the liner 204 above the hardmask layer 202 and between the fins 102, and etching continues on the NFET side to create an opening (e.g., analogous to opening 300) not shown. Once the NFET side is etched, the block mask over the PFET side can be removed (or removed later), and bottom source/drain layer 404 is formed for the NFET side in the opening (e.g., analogous to forming bottom source/drain layer 402 in opening 300 in FIG. 12A) as depicted in FIG. 12B.

Figure 14B:
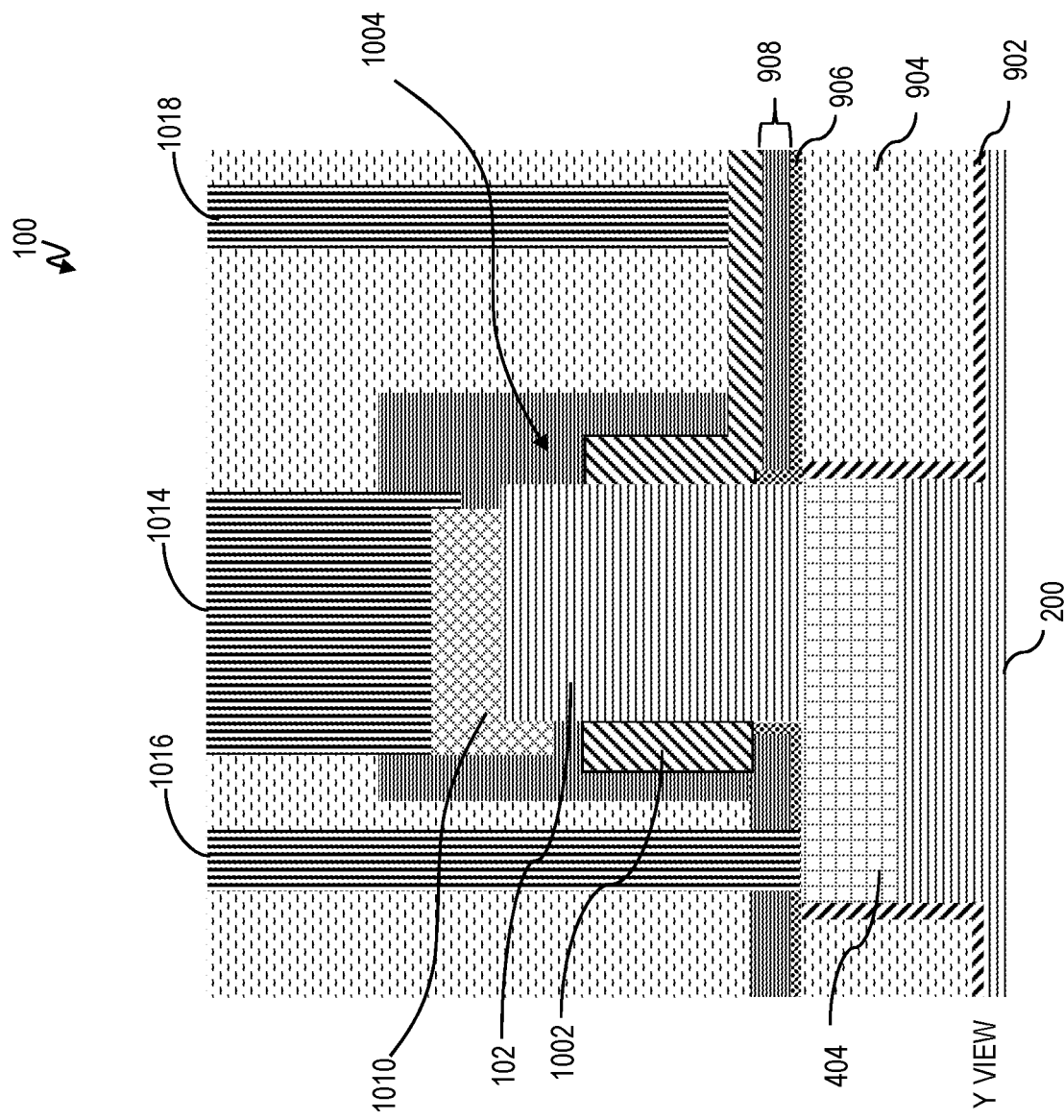
FIG. 14B depicts a cross-sectional view of the semiconductor device after metallization according to one or more embodiments of the invention.

Further, fabrication operations can be performed to complete the PFET and NFET as understood by one skilled in the art, and methods to complete the VTFETs are not meant to be limited. FIG. 14A depicts a cross-sectional view of the semiconductor device 100 taken along X2 for the NFET side according to one or more embodiments of the invention. FIG. 14B depicts a cross-sectional view of the semiconductor device 100 taken along Y for the NFET side according to one or more embodiments of the invention. Analogous fabrication operations discussed in FIGS. 14A and 14B for the NFET side are performed for the PFET side. FIGS. 14A and 14B are analogous to FIGS. 10A and 10B, except the fins 102 in FIGS. 14A and 14B have not been undercut, and therefore, the bottom source/drain layer 402 does not have a step portion or pedestal upward toward the gate material 1002.

According to one or more embodiments of the invention, a method of forming a semiconductor device is provided. The method includes forming a first epitaxial material (e.g., with height D1 as depicted in FIGS. 4A and 4B) under a bottom surface of a plurality of vertical fins 102, the first epitaxial material being under fin channel regions of the plurality of vertical fins 102. The method includes forming a second epitaxial material (e.g., with height D1 as depicted in FIGS. 4A and 4B) adjacent to the first epitaxial material and remote from the fin channel regions, a combination of the first epitaxial material and the second epitaxial material forming a bottom source/drain layer (e.g., bottom source/drain layers 402, 404). Also, the method includes forming a top source/drain layer (e.g., top source/drain layer 1010) on an upper portion of the plurality of vertical fins 102, gate material (e.g., gate material 1002) being disposed around the plurality of vertical fins between the top source/drain layer and the bottom source/drain layer.

Additionally, a top surface of the second epitaxial material is formed between two of the plurality of vertical fins 102. A bottom surface of the first epitaxial material and the second epitaxial material include a substantially undulating profile. A bottom surface of the first epitaxial material and the second epitaxial material includes a substantially flat profile. A first height of the first epitaxial material (e.g., height D1) is greater than a second height of the second epitaxial material (e.g., height D2), a difference in the first height and the second height being less than the second height (e.g., D1−D2<D2). A height of the first epitaxial material and the second epitaxial material are substantially equal (e.g., D1 equals D2 in FIGS. 13A and 13B). A spacer material (e.g., bottom spacer layer 908) is formed between the gate material and the bottom source/drain layer, a combined height of the spacer material (e.g., height D3) and the second epitaxial material (e.g., height D2) being greater than a height of the first epitaxial material (e.g., height D1).

According to one or more embodiments of the invention, a method of forming a semiconductor device 100 is provided. The method includes forming fins 102 on a substrate 200, the fins and the substrate 200 having a liner 204, the liner 204 being patterned to expose at least part of the substrate 200. The method includes creating an opening (e.g., opening 300) underneath the fins 102 by etching a portion of the substrate underneath the fins. Also, the method includes forming a source/drain layer (e.g., bottom source/drain layer 402, 404) in the opening.

Further, forming the source/drain layer in the opening includes causing epitaxial growth of material forming the source/drain layer from a bottom of the fins and a top of the substrate. Forming the source/drain layer in the opening includes causing epitaxial growth of material forming the source/drain layer, a portion of the material having a height determined by a bottom of the liner. Creating the opening causes a bottom portion of the fins to be undercut (e.g., gaps 302) resulting in a higher bottom surface of the fins. Forming the source/drain layer in the opening causes epitaxial growth from the higher bottom surface of the fins responsive to undercutting the bottom portion and causes epitaxial growth from a top of the substrate. One or more locations of the fins and one or more other locations of the fins are protected with a block mask 502. A partial recess of the block mask is performed at the one or more other locations in order to expose at least a portion of the fins at the one or more other locations (e.g., as depicted in FIG. 6B), and a fin cut is performed on the fins at the one or more other locations. (e.g., as depicted in FIG. 7B).

According to one or more embodiments of the invention, a method of forming a semiconductor device 100 is provided. The method includes forming fins 102 on an insulator material (e.g., insulator layer 1102 as depicted in FIG. 11), the insulator material being formed on a substrate 200, the fins and the insulator material having a liner 204, the liner being patterned to expose at least part of the insulator material. The method includes creating an opening (e.g., opening 300) underneath the fins by etching the insulator material underneath the fins, and forming a source/drain layer (e.g., bottom source/drain layer 402, 404) in the opening.

One or more locations of the fins and one or more other locations of the fins are protected with a block mask 502. A partial recess of the block mask is performed at the one or more other locations in order to expose at least a portion of the fins at the one or more other locations (e.g., as depicted in FIG. 6B), and a fin cut is performed on the fins at the one or more other locations. (e.g., as depicted in FIG. 7B).

Terms such as "epitaxial growth" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a semiconductor device, the method comprising:
    forming a set of fins on a substrate, the set of fins and the substrate having a liner, the liner being patterned to expose at least part of the substrate;
    creating an opening underneath the set of fins by etching a portion of the substrate underneath the set of fins; and
    forming a source/drain layer in the opening, a portion of the source/drain layer is formed with a tapered profile that narrows in one dimension.

2. The method of claim 1, wherein forming the source/drain layer in the opening comprises causing epitaxial growth of material forming the source/drain layer from a bottom of the set of fins and a top of the substrate.

3. The method of claim 1, wherein forming the source/drain layer in the opening comprises causing epitaxial growth of a material forming the source/drain layer, a portion of the material having a height determined by a bottom of the liner.

4. The method of claim 1, wherein creating the opening causes a bottom portion of the set of fins to be undercut resulting in a higher bottom surface of the set of fins.

5. The method of claim 4, wherein forming the source/drain layer in the opening causes epitaxial growth from the higher bottom surface of the set of fins responsive to undercutting the bottom portion and causes epitaxial growth from a top of the substrate.

6. The method of claim 1 further comprising:
    protecting one or more locations of the set of fins and one or more other locations of the set of fins by a block mask;
    performing a partial recess of the block mask at the one or more other locations in order to expose at least a portion of the set of fins at the one or more other locations; and
    performing a fin cut on the set of fins at the one or more other locations.

* * * * *